US012685207B2

(12) United States Patent
Fu et al.

(10) Patent No.: US 12,685,207 B2
(45) Date of Patent: Jul. 14, 2026

(54) SEMICONDUCTOR DEVICE PACKAGE WITH WETTABLE FLANKS

(71) Applicant: Texas Instruments Incorporated, Dallas, TX (US)

(72) Inventors: Yu Fu, Huizhou City (CN); Huo Yun Duan, Chengdu (CN); Fu Ren Pang, Chengdu (CN); Longting Li, Chengdu (CN); Zheng Qing Fan, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 390 days.

(21) Appl. No.: 18/346,164

(22) Filed: Jun. 30, 2023

(65) Prior Publication Data

US 2025/0006510 A1 Jan. 2, 2025

(51) Int. Cl.
*H10W 70/04* (2026.01)
*H05K 3/341* (2026.01)
(Continued)

(52) U.S. Cl.
CPC ........ *H10W 74/014* (2026.01); *H05K 3/3436* (2013.01); *H10W 70/048* (2026.01);
(Continued)

(58) Field of Classification Search
CPC ............... H01L 21/561; H01L 21/4842; H01L 23/3121; H01L 23/49548; H01L 24/16;
(Continued)

(56) References Cited

U.S. PATENT DOCUMENTS 9,741,642 B1 * 8/2017 Nondhasitthichai ........................
H01L 21/4821
2011/0244629 A1 * 10/2011 Gong ................ H01L 23/49582
438/111

FOREIGN PATENT DOCUMENTS

EP 2881984 B1 * 3/2019 ............. H01L 24/67

OTHER PUBLICATIONS

NXP, Application Note, "AN1902 Assembly guidelines for QFN (quad flat no-lead) and SON (small outline no-lead) packages" Rev. Apr. 9-28, 2021 Document, NXP B.V., 2021; retrieved from the world wide web on Jun. 30, 2023 at uniform resource locator (url) address: https://www.nxp.com/docs/en/application-note/AN1902. pdf.

(Continued)

*Primary Examiner* — Mohammad M Choudhry
(74) *Attorney, Agent, or Firm* — Dawn Jos; Frank D. Cimino

(57) ABSTRACT

In a described example, an example no-lead semiconductor device package includes: a die pad in a central portion of a partially etched leadframe and terminals. The terminals include a device side surface formed in an upper layer of the partially etched leadframe, and a first exterior end in the upper layer; a board side surface formed in a lower layer of the partially etched leadframe extending from the upper layer; a second exterior end in the lower layer, the second exterior end inset from the first exterior end, and an inset portion extending from the first exterior end to the second exterior end. A semiconductor die is mounted to the die pad. Mold compound covers the semiconductor die, the second exterior end of the terminals and the inset portion of the terminals are exposed from the mold compound, with the mold compound extending along sides of the terminals.

20 Claims, 15 Drawing Sheets

(51) Int. Cl.

| | |
|---|---|
| *H10W 70/40* | (2026.01) |
| *H10W 74/01* | (2026.01) |
| *H10W 74/10* | (2026.01) |
| *H10W 72/00* | (2026.01) |
| *H10W 72/30* | (2026.01) |
| *H10W 72/50* | (2026.01) |
| *H10W 90/00* | (2026.01) |

(52) U.S. Cl.
CPC ..... *H10W 70/424* (2026.01); *H10W 72/0198* (2026.01); *H10W 74/114* (2026.01); *H10W 70/417* (2026.01); *H10W 72/073* (2026.01); *H10W 72/07307* (2026.01); *H10W 72/075* (2026.01); *H10W 72/07507* (2026.01); *H10W 72/07521* (2026.01); *H10W 72/07533* (2026.01); *H10W 72/354* (2026.01); *H10W 72/536* (2026.01); *H10W 72/5363* (2026.01); *H10W 72/552* (2026.01); *H10W 72/5522* (2026.01); *H10W 72/5525* (2026.01); *H10W 72/555* (2026.01); *H10W 72/884* (2026.01); *H10W 90/726* (2026.01); *H10W 90/736* (2026.01); *H10W 90/756* (2026.01)

(58) Field of Classification Search
CPC ......... H01L 24/29; H01L 24/32; H01L 24/45; H01L 24/48; H01L 24/73; H01L 24/83; H01L 24/85; H01L 24/92; H01L 24/97; H01L 23/49513; H01L 2224/16245; H01L 2224/2919; H01L 2224/32245; H01L 2224/45139; H01L 2224/45144; H01L 2224/45147; H01L 2224/45664; H01L 2224/48091; H01L 2224/48245; H01L 2224/48465; H01L 2224/73265; H01L 2224/83005; H01L 2224/83192; H01L 2224/85005; H01L 2224/85181; H01L 2224/85205; H01L 2224/92247; H01L 2224/95001; H01L 2224/97; H01L 2924/0665; H01L 23/3107; H01L 23/49541; H01L 23/49582; H05K 3/3436
See application file for complete search history.

(56) References Cited

OTHER PUBLICATIONS

Ankit Gupta and Katelyn Wiggenhorn, Application Report, "Enhanced HotRod™ QFN Package: Achieving Low EMI Performance in Industry's Smallest 4-A Converter", SNVA935A—Jun. 2020—Revised Jul. 2021, Texas Instruments Incorporated, 2021; retrieved from the world wide web on Jun. 30, 2023 at uniform resource locator (url) address: https://www.ti.com/lit/an/snva935a/snva935a.pdf?ts=1648065211573&ref_url=https%253A%252F%252Fwww.google.com%252F.

* cited by examiner

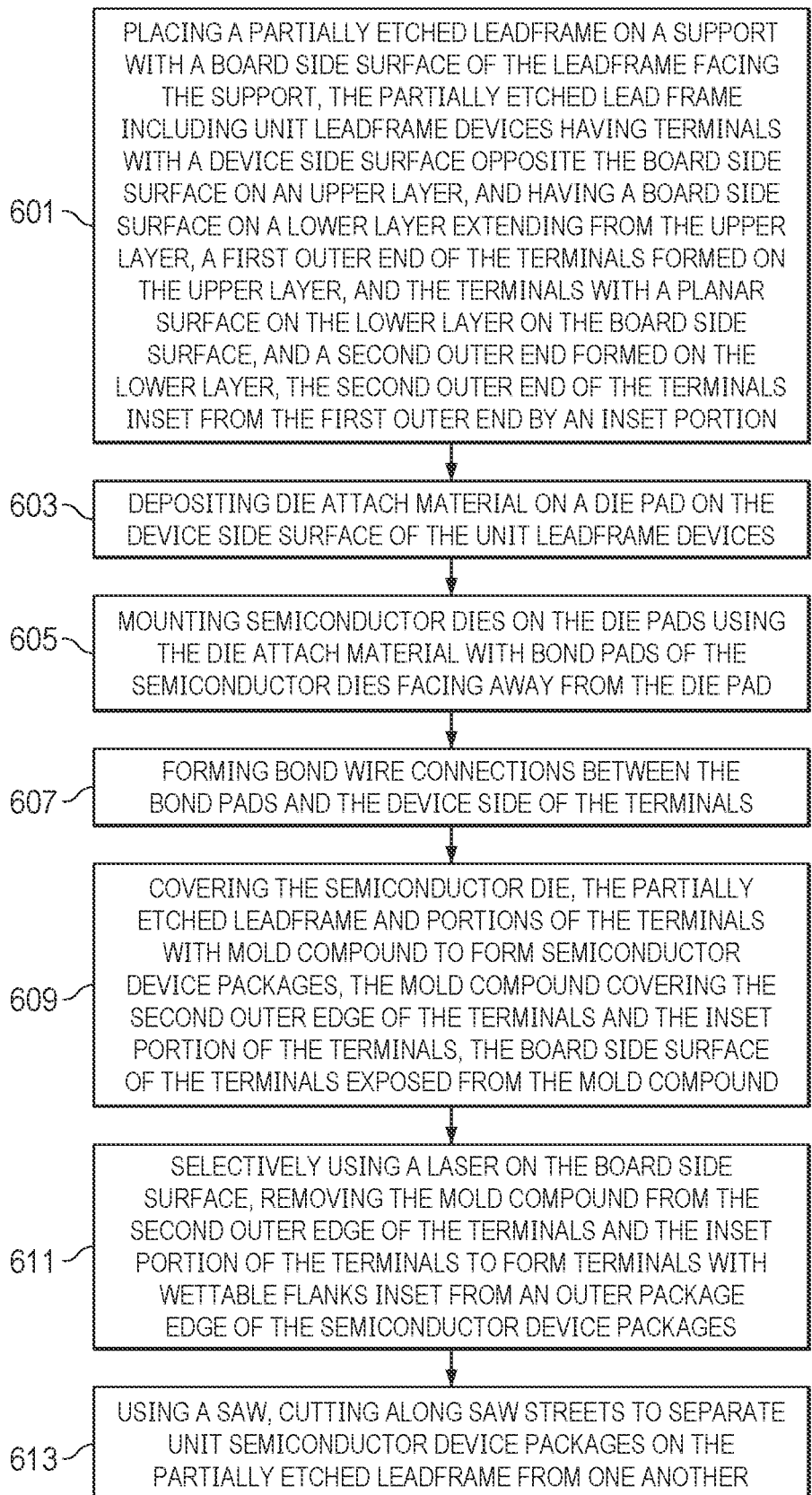

601 — PLACING A PARTIALLY ETCHED LEADFRAME ON A SUPPORT WITH A BOARD SIDE SURFACE OF THE LEADFRAME FACING THE SUPPORT, THE PARTIALLY ETCHED LEAD FRAME INCLUDING UNIT LEADFRAME DEVICES HAVING TERMINALS WITH A DEVICE SIDE SURFACE OPPOSITE THE BOARD SIDE SURFACE ON AN UPPER LAYER, AND HAVING A BOARD SIDE SURFACE ON A LOWER LAYER EXTENDING FROM THE UPPER LAYER, A FIRST OUTER END OF THE TERMINALS FORMED ON THE UPPER LAYER, AND THE TERMINALS WITH A PLANAR SURFACE ON THE LOWER LAYER ON THE BOARD SIDE SURFACE, AND A SECOND OUTER END FORMED ON THE LOWER LAYER, THE SECOND OUTER END OF THE TERMINALS INSET FROM THE FIRST OUTER END BY AN INSET PORTION

603 — DEPOSITING DIE ATTACH MATERIAL ON A DIE PAD ON THE DEVICE SIDE SURFACE OF THE UNIT LEADFRAME DEVICES

605 — MOUNTING SEMICONDUCTOR DIES ON THE DIE PADS USING THE DIE ATTACH MATERIAL WITH BOND PADS OF THE SEMICONDUCTOR DIES FACING AWAY FROM THE DIE PAD

607 — FORMING BOND WIRE CONNECTIONS BETWEEN THE BOND PADS AND THE DEVICE SIDE OF THE TERMINALS

609 — COVERING THE SEMICONDUCTOR DIE, THE PARTIALLY ETCHED LEADFRAME AND PORTIONS OF THE TERMINALS WITH MOLD COMPOUND TO FORM SEMICONDUCTOR DEVICE PACKAGES, THE MOLD COMPOUND COVERING THE SECOND OUTER EDGE OF THE TERMINALS AND THE INSET PORTION OF THE TERMINALS, THE BOARD SIDE SURFACE OF THE TERMINALS EXPOSED FROM THE MOLD COMPOUND

611 — SELECTIVELY USING A LASER ON THE BOARD SIDE SURFACE, REMOVING THE MOLD COMPOUND FROM THE SECOND OUTER EDGE OF THE TERMINALS AND THE INSET PORTION OF THE TERMINALS TO FORM TERMINALS WITH WETTABLE FLANKS INSET FROM AN OUTER PACKAGE EDGE OF THE SEMICONDUCTOR DEVICE PACKAGES

613 — USING A SAW, CUTTING ALONG SAW STREETS TO SEPARATE UNIT SEMICONDUCTOR DEVICE PACKAGES ON THE PARTIALLY ETCHED LEADFRAME FROM ONE ANOTHER

FIG. 6

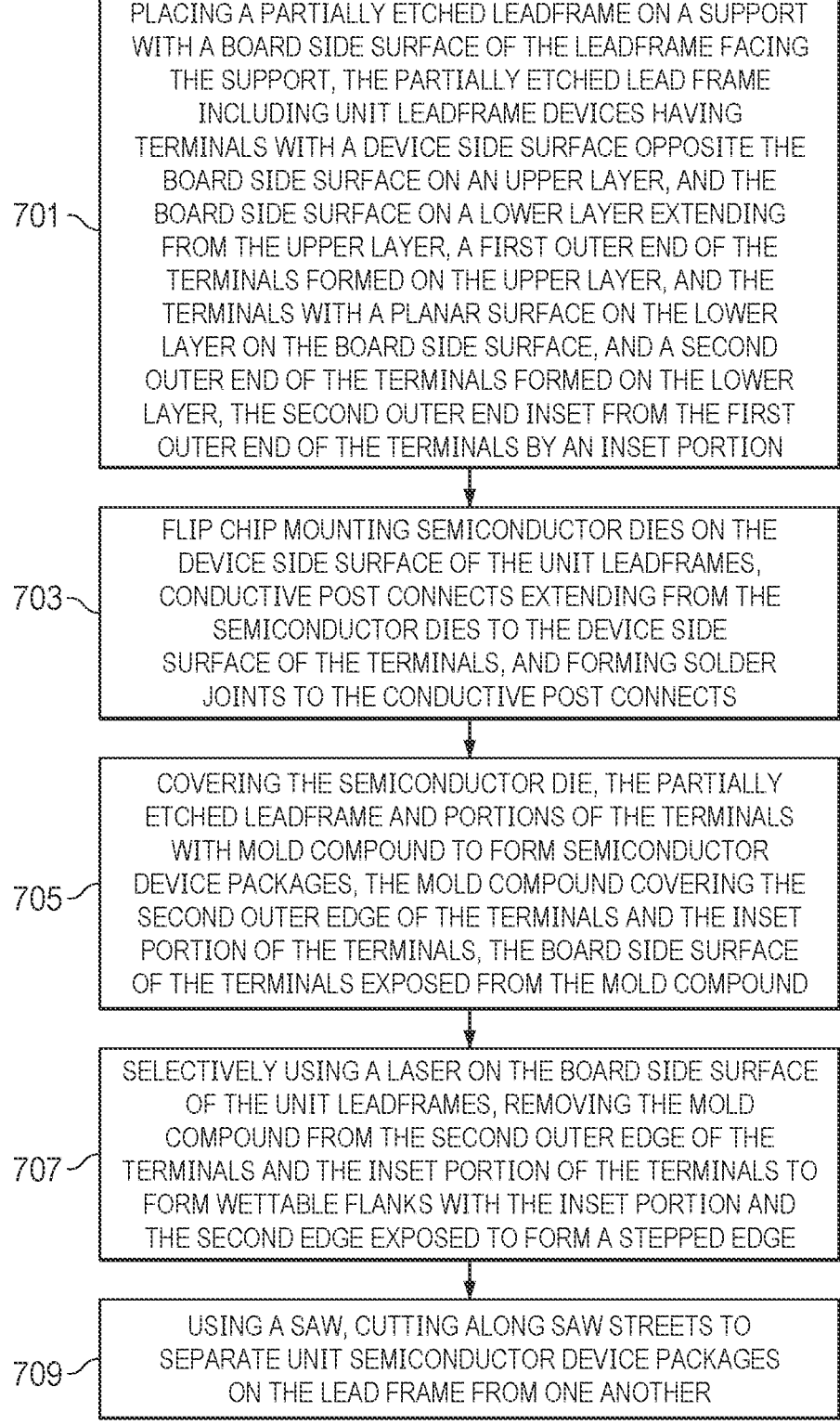

701 ~ PLACING A PARTIALLY ETCHED LEADFRAME ON A SUPPORT WITH A BOARD SIDE SURFACE OF THE LEADFRAME FACING THE SUPPORT, THE PARTIALLY ETCHED LEAD FRAME INCLUDING UNIT LEADFRAME DEVICES HAVING TERMINALS WITH A DEVICE SIDE SURFACE OPPOSITE THE BOARD SIDE SURFACE ON AN UPPER LAYER, AND THE BOARD SIDE SURFACE ON A LOWER LAYER EXTENDING FROM THE UPPER LAYER, A FIRST OUTER END OF THE TERMINALS FORMED ON THE UPPER LAYER, AND THE TERMINALS WITH A PLANAR SURFACE ON THE LOWER LAYER ON THE BOARD SIDE SURFACE, AND A SECOND OUTER END OF THE TERMINALS FORMED ON THE LOWER LAYER, THE SECOND OUTER END INSET FROM THE FIRST OUTER END OF THE TERMINALS BY AN INSET PORTION

703 ~ FLIP CHIP MOUNTING SEMICONDUCTOR DIES ON THE DEVICE SIDE SURFACE OF THE UNIT LEADFRAMES, CONDUCTIVE POST CONNECTS EXTENDING FROM THE SEMICONDUCTOR DIES TO THE DEVICE SIDE SURFACE OF THE TERMINALS, AND FORMING SOLDER JOINTS TO THE CONDUCTIVE POST CONNECTS

705 ~ COVERING THE SEMICONDUCTOR DIE, THE PARTIALLY ETCHED LEADFRAME AND PORTIONS OF THE TERMINALS WITH MOLD COMPOUND TO FORM SEMICONDUCTOR DEVICE PACKAGES, THE MOLD COMPOUND COVERING THE SECOND OUTER EDGE OF THE TERMINALS AND THE INSET PORTION OF THE TERMINALS, THE BOARD SIDE SURFACE OF THE TERMINALS EXPOSED FROM THE MOLD COMPOUND

707 ~ SELECTIVELY USING A LASER ON THE BOARD SIDE SURFACE OF THE UNIT LEADFRAMES, REMOVING THE MOLD COMPOUND FROM THE SECOND OUTER EDGE OF THE TERMINALS AND THE INSET PORTION OF THE TERMINALS TO FORM WETTABLE FLANKS WITH THE INSET PORTION AND THE SECOND EDGE EXPOSED TO FORM A STEPPED EDGE

709 ~ USING A SAW, CUTTING ALONG SAW STREETS TO SEPARATE UNIT SEMICONDUCTOR DEVICE PACKAGES ON THE LEAD FRAME FROM ONE ANOTHER

FIG. 7

SEMICONDUCTOR DEVICE PACKAGE WITH WETTABLE FLANKS

TECHNICAL FIELD

This disclosure relates generally to semiconductor device packages, and more particularly to semiconductor device packages including a semiconductor die mounted to a lead-frame in a molded package.

BACKGROUND

Leadless semiconductor device packages including small outline no-lead (SON) and quad flat no-lead (QFN) type packages are increasingly used. No-lead packages have external terminals that are formed within the area of the semiconductor device package body, and which are config-ured for surface mounting to a board. Because the package terminals are exposed lead portions that are placed beneath the package body, the total board area needed for the no-lead semiconductor device package is reduced when compared to leaded semiconductor device package types, which require more board area for mounting.

No-lead packages can be formed using a leadframe, and when the package includes a leadframe the package can be referred to as a leadless leadframe semiconductor device package. The no-lead package can be formed using a face up mounted semiconductor die that is electrically connected to leads of the leadframe by bond wires. The bond wires can be formed in a wire bonding process. Alternatively, a no-lead semiconductor device package can be formed using a "flip chip" mounted semiconductor die that is mounted with the device side facing the leadframe, and using conductive post connects with solder at distal ends, mounting the semicon-ductor die to the leadframe. Sometimes these devices may be referred to as "flip chip on lead" or "FCOL" packaged devices.

In a wire bonded semiconductor device package, the semiconductor die has bond pads that are used to form electrical connections to the leads using bond wires. Wire bonding is a process long used in the semiconductor indus-try, and has the advantages of allowing for flexible semi-conductor die sizes and flexible bond pad placement on the semiconductor dies for use in packaging processes. When a wire bonding tool makes a stitch bond to the surface of a cantilever lead, the wire bonding tool applies mechanical pressure to form the stitch bond to a surface of the lead and pushes against the lead.

Recently no-lead semiconductor device packages are used with "wettable flanks." The term "flank" refers to the sides or ends of the terminals, which have a board side surface that is exposed from the mold compound, and a side or "flank" that extends perpendicularly away from the board side surface, on a side surface of the no-lead package body. "Wettable flanks" on no-lead package terminals are shaped to increase the solder volume when the package is mounted to a system board or module using surface mount technology (SMT) processes by being inset from the external boundary of the semiconductor device package. The shape of the wettable flank allows solder to "wet" or adhere to the sides of the terminals during surface mount processes. Wettable flank terminals on no-lead packages are advantageous because during manufacture of printed circuit boards (PCBs) using SMT, inspections of the solder joints, which can be by human visual inspection or by automated optical inspection (AOI), are enhanced by using wettable flanks. Increasing the visible side-wetting of solder that extends from the terminals in the finished solder joints increases the visual inspection capabilities, as the solder is more visible from a top view of the SMT device (when compared to SMT devices mounted using non-wettable flank terminals, where the device body may obscure the solder joint from visual inspection in a top view). Use of wettable flanks for the terminals increase the surface area the solder can wet during a surface mount technology soldering process, improving the solder joints.

In one approach, wettable flanks have been formed using a dimple process in making the leadframes. The dimple is an etched area at the center and outer end of the terminals. However, when the molded devices are later sawed apart, the dimple walls may crush or deform due to the thin walls of remaining terminal material around the dimple, and burrs often form during sawing. In an alternative approach, the terminals have a saw cut edge. This approach requires multiple saw cuts. A two-pass sawing operation makes a half cut through the terminals, a deburr process is needed to clean the burrs from the terminals, then an additional full cut sawing operation cuts through the mold compound and finally separates the devices. Even using deburr processes, the risk of burrs remaining in the dimples, which can cause solder to fail during SMT processing, remains high and the burrs are hard to detect in a vision system inspection. These approaches require a minimum pitch distance between the terminals of about 0.5 mm to prevent shorts between termi-nals. When multiple saw cuts are used to form the wettable flanks, this also requires a complicated sawing operation, adding costs.

An effective, reliable, and cost-efficient method is needed to make no-lead semiconductor device packages with wet-table flanks at increasingly smaller pitch distances.

SUMMARY

In a described example, a method includes: placing a partially etched leadframe on a support with a board side surface of the leadframe facing the support, the partially etched leadframe including unit leadframe devices having terminals with a device side surface opposite the board side surface on an upper layer, and having the board side surface on a lower layer extending from the upper layer, a first exterior end of the terminals formed on the upper layer, and the terminals with a planar surface on the lower layer on the board side surface, and a second exterior end formed on the lower layer, the second exterior end of the terminals inset from the first exterior end by an inset portion. Die attach material is deposited on a die pad on the device side surface of the unit leadframe devices. Semiconductor dies are mounted on the die pads using the die attach material with bond pads of the semiconductor dies facing away from the die pad. The method continues by forming bond wire connections between the bond pads and the device side of the terminals. Mold compound is formed covering the semiconductor dies, the partially etched leadframe and por-tions of the terminals to form semiconductor device pack-ages, the mold compound covering the second end of the terminals and the inset portion of the terminals, the board side surface of the terminals exposed from the mold com-pound. A laser is selectively used on the board side surface of the unit leadframes, removing the mold compound from at least the second end of the terminals and the inset portion of the terminals. The method continues by using a saw and cutting along saw streets between the unit leadframes to form separate unit semiconductor device packages.

In a further described example, another method includes: placing a partially etched leadframe on a support with a board side surface of the leadframe facing the support, the partially etched leadframe including unit leadframe devices having terminals with a device side surface opposite the board side surface on an upper layer, and the board side surface on a lower layer extending from the upper layer, a first exterior end of the terminals formed on the upper layer, and the terminals with a planar surface on the lower layer on the board side surface, and a second exterior end of the terminals formed on the lower layer, the second exterior end inset from the first exterior end of the terminals by an inset portion. Semiconductor dies are flip chip mounted on the device side surface of the unit leadframes, with conductive post connects extending from the semiconductor dies to the device side surface of the terminals, and forming solder joints to the conductive post connects. Mold compound is formed that covers the semiconductor die, the partially etched leadframe and portions of the terminals form semiconductor device packages, the mold compound covering the second exterior end of the terminals and the inset portion of the terminals, the board side surface of the terminals exposed from the mold compound. A laser is selectively used on the board side surface of the unit leadframes, removing the mold compound from second exterior end of the terminals and the inset portion of the terminals to form wettable flanks with the inset portion and the second end exposed to form a stepped edge. The method completes by using a saw, cutting along saw streets between the unit leadframe devices to separate unit semiconductor device packages on the partially etched leadframe from one another.

In an additional example, an apparatus includes a die pad in a central portion of a partially etched leadframe, the die pad having a device side surface and an opposite board side surface. Terminals are spaced from the die pad, the terminals including: a device side surface formed in an upper layer of the partially etched leadframe, and a first exterior end in the upper layer of the partially etched leadframe; a board side surface formed in a lower layer of the partially etched leadframe extending from the upper layer, the board side surface of the terminal opposite the device side surface; a second exterior end in the lower layer of the partially etched leadframe, the second exterior end inset from the first exterior end, and an inset portion extending from the first exterior end to the second exterior end. A semiconductor die is mounted to the device side surface of the die pad by die attach material and has bond pads on a device side surface facing away from the die pad. Wire bonds connect the bond pads of the semiconductor die to the device side surface of the terminals. Mold compound covers the semiconductor die, the die pad, and the wire bonds, with the second exterior end of the terminals and the inset portion of the terminals exposed from the mold compound to form wettable flanks with the inset portion and the second end exposed from the mold compound to form a stepped edge, with mold compound extending along sides of the terminals.

In yet another described example, an apparatus includes a partially etched leadframe including terminals, the terminals including: a device side surface formed in an upper layer of the partially etched leadframe, and a first exterior end in the upper layer of the partially etched leadframe; a board side surface formed in a lower layer of the partially etched leadframe extending from the upper layer, the board side surface of the terminal opposite the device side surface; a second exterior end in the lower layer of the partially etched leadframe, the second exterior end inset from the first exterior end, and an inset portion extending from the first exterior end to the second exterior end. A semiconductor die is flip chip mounted to the device side surface of the terminals by solder joints between post connects extending from bond pads on the semiconductor die and the device side surface of the terminals. Mold compound covers the semiconductor die and portions of the terminals, with the second exterior end of the terminals and the inset portion of the terminals exposed from the mold compound to form wettable flanks with the inset portion and the second exterior end forming stepped edges on the terminals, with mold compound extending along the sides of the terminals.

BRIEF DESCRIPTION OF THE DRAWINGS

FIG. 6 illustrates, in a flow diagram, a method for forming a semiconductor device package of an arrangement.

FIG. 7 illustrates, in a further flow diagram, a method for forming a semiconductor device package of an alternative arrangement.

DETAILED DESCRIPTION

Figure 1A:
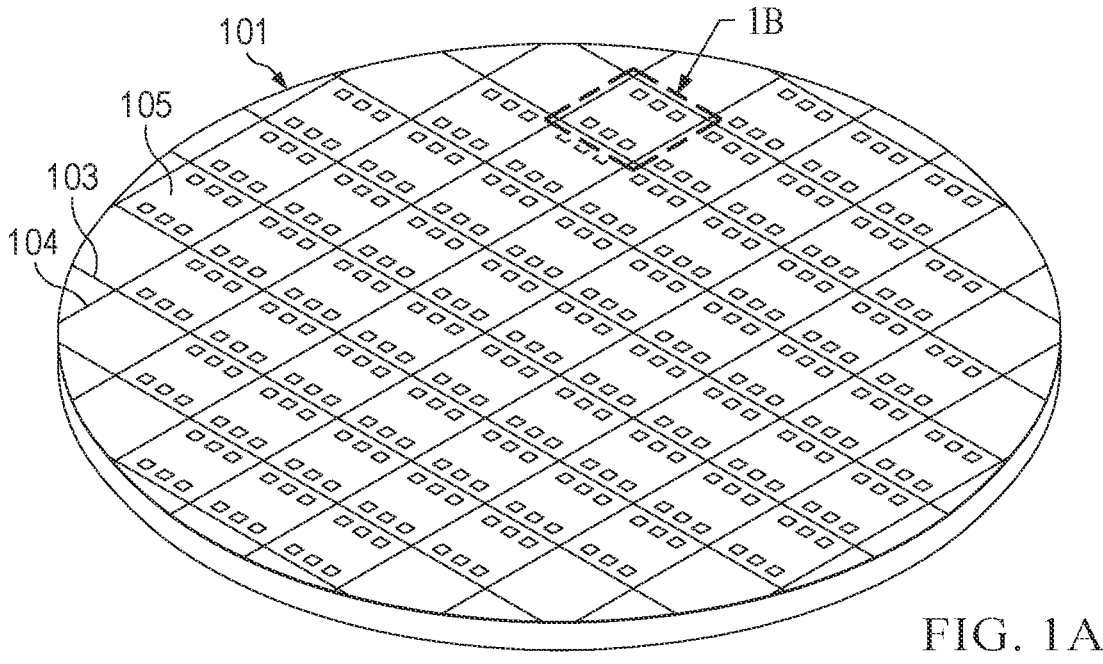
FIGS. 1A-1B illustrate, in a projection view and a close-up projection view, respectively, semiconductor dies on a semiconductor wafer, and an individual semiconductor die from the semiconductor wafer which can be used with the arrangements.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements, conductors, or wires are coupled. In an example arrangement, a sensor receives a magnetic field from a conductor carrying current and is coupled to the conductor, even though the sensor is isolated from the conductor, and no current flows between the sensor and the conductor.

The term "semiconductor die" is used herein. The semiconductor die can include passive devices such as resistors, inductors, filters, sensors, or active devices such as transistors. The semiconductor die can be an integrated circuit with hundreds or thousands of transistors coupled to form a functional circuit, for example a microprocessor or memory device. In an example arrangement, the semiconductor die can include a power field effect transistor (power FET) or multiple power FETs. Power FETs can supply current to a load in a range from about 1 ampere to tens or hundreds of amperes. Power integrated circuit devices can include control circuitry, feedback and over current sensors, gate driver devices, and power FETs, in an integrated device configured to enable switching power circuits on a board using few additional components, such as a buck converter, a boost converter, or a buck-boost converter that provides current to a load from a power supply.

The term "semiconductor device package" is used herein. A semiconductor device package has at least one semiconductor die electrically coupled to terminals, and has a package body that protects and covers the semiconductor die. The semiconductor device package can include additional elements. Passive components such as sensors, antennas, capacitors, coils, inductors, and resistors can be included. In some arrangements, multiple semiconductor dies can be packaged together. Circuitry that combines functions such as a sensor and an amplifier semiconductor die and a logic semiconductor die (such as a controller die or digital filter) can be packaged together to from a single semiconductor device package. The semiconductor die is/are mounted to a package substrate that provides conductive leads. A portion of the conductive leads form external leads for the packaged device. In wire bonded semiconductor device packages used in the arrangements, bond wires or ribbon bonds couple conductive leads of a package substrate to bond pads on the semiconductor die. In an alternative approach, flip chip mounted semiconductor dies can be packaged in a semiconductor device package. In flip chip mounted semiconductor device packages of the arrangements, the semiconductor die has post connects extending from bond pads that have solder at a distal end. The post connects are then brought into contact with and mounted to the leads of the leadframe using a solder reflow process. The semiconductor device package can have a package body formed by a thermoset epoxy resin in a molding process, or by the use of epoxy, plastics, or resins that are liquid at room temperature and are subsequently cured. The package body may provide a hermetic package for the packaged device. The package body may be formed in a mold using an encapsulation process, however, during encapsulation a portion of the leads of the package substrate are not covered by mold compound, these exposed lead portions provide the terminals for the semiconductor device package.

The term "package substrate" is used herein. A package substrate is a substrate arranged to receive a semiconductor die and to support the semiconductor die in a completed semiconductor device package. Package substrates can include conductive leadframes, which can be formed from copper, aluminum, stainless steel, steel and alloys such as Alloy 42 and copper alloys. Conductive leads are configured for coupling to bond pads on the semiconductor die. In an example arrangement, the electrical connections from the bond pads to the leads are formed using wire bonds. The leadframes can be provided in strips, grids or arrays. The conductive leadframes can be provided as a panel or grid with strips or arrays of unit leadframe portions in rows and columns. Semiconductor dies can be placed on respective unit device leadframe portions within the strips or arrays. The leadframe leads may have plated portions in areas designated for wire bond connections to the semiconductor die, for example silver plating can be used.

In packaging semiconductor devices, mold compound may be used to partially cover a package substrate, to cover components, to cover a semiconductor die or multiple semiconductor dies, and to cover the electrical connections from the semiconductor die or dies to the package substrate. This molding process can be referred to as an "encapsulation" process, although some portions of the package substrates are not covered in the mold compound during encapsulation. For example, in the arrangements portions of the leads are left exposed from the mold compound. Encapsulation is often a compressive molding process, where thermoset mold compound such as resin epoxy can be used. Mold compound used in electronic packaging is sometimes referred to as "EMC" or "epoxy mold compound." A room temperature solid or powder mold compound can be heated to a liquid state, and then transfer molding can be performed by pressing the liquid mold compound into a mold through runners or channels. Unit molds shaped to surround an individual device may be used, or block molding may be used. The molding process forms multiple packages simultaneously for several devices. The devices to be molded can be provided in an array or matrix of several, hundreds or even thousands of devices in rows and columns on a leadframe strip. The semiconductor devices that are then molded at the same time to increase throughput.

The term "scribe lane" is used herein. A scribe lane is a portion of semiconductor wafer between semiconductor dies. Sometimes the term "scribe street" is used. Once semiconductor processing is completed and the semiconductor devices are complete, the semiconductor devices are separated into individual semiconductor dies by severing the semiconductor wafer along the scribe lanes. The separated dies can then be removed and handled individually for further processing. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area defined between molded semiconductor device packages and used to allow a saw, such as a mechanical blade, laser or other cutting tool to pass between the molded semiconductor device packages to separate the devices from one another. This process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are normal to each other and the saw will traverse the molded electronic devices in two different directions to cut apart the packaged electronic devices from one another in the array.

In the arrangements, a semiconductor device package includes a semiconductor die mounted to a leadframe. In one example arrangement, the semiconductor die is mounted on a die pad and has wire bond connections between the semiconductor die and leads of the leadframe. The leadframe has the die pad in a central portion for mounting the semiconductor die. The leadframe has leads with interior ends proximate to but spaced from the die pad. The leadframe leads form terminals for the semiconductor device package. In alternative arrangements, the semiconductor die is flip chip mounted to the leadframe.

In example arrangements, a package substrate is a partially etched leadframe. A partially etched leadframe can be formed from a sheet material, such as copper or a copper alloy, using etch processes performed from two opposite sides of the sheet. Two layers having different patterns (the two layers are in contact with each other in some full thickness areas after etching, as part of the whole leadframe) can be formed using partial etch processing. In the arrangements, the terminals of the leadframe are formed as leads with a device side surface on an upper layer, and a board side surface on a lower layer. The terminals have a stepped edge at an exterior end, the end facing away from the die pad or away from the center of the leadframe. The upper layer of the terminals has a first exterior end that extends to and is coplanar with an exterior side of the mold compound that forms the body of the semiconductor device package. The lower layer has a second exterior end that is inset from the first exterior end, and has a stepped edge that is perpendicular to a board side or bottom surface of the lower layer. The upper layer has an inset portion that extends from the first exterior end to the second exterior end, forming the stepped edge for the terminal. The bottom surface of the lower layer is a board side surface of the terminals and is coplanar with a board side surface of the semiconductor device package. The stepped edge and inset portion of the terminals form wettable flanks for the semiconductor device package. Solder can wet the bottom surface of the terminals, the stepped edge including the second exterior end and the inset portion, increasing the solder volume when the semiconductor device package is surface mounted to a board (when compared to solder joints on a non-wettable flank package formed without the arrangements). The increased solder volume (compared to terminals formed without use of the arrangements) increases the visible portion of the solder joints that extends from the terminals, making visual inspection of the solder joints from an overhead perspective of the mounted devices easier and more efficient, whether human visual inspection or automated optical inspection is used.

In a method of forming the arrangements, a laser is used. After mold compound covers the semiconductor die and portions of the leadframe with mold compound, while the board side surface of the terminals remains exposed from the mold compound, the mold compound covers the stepped edge and inset portions of the terminals. A pulsed laser is used to ablate or burn off the mold compound from the exterior ends of the terminals, exposing the stepped edge and inset portions from the mold compound. The mold compound remains between the adjacent terminals and so the exposed portions of the terminals have mold compound extending along the sides. After the laser process is performed, a single sawing operation is performed cutting through the leadframe and the mold compound between the packaged devices, separating the devices. The single sawing operation forms the edges of the semiconductor device packages, exposing the stepped edge and the inset portion of the terminals for SMT processing. The terminals have full thickness mold compound along the sides. When the solder joints are formed in an SMT process to mount the semiconductor device packages of the arrangements, the wettable flanks of the terminals increase the solder volume and wetted area, while the mold compound on the sides of the terminals helps contain the solder and prevent shorts between the terminals, allowing for finer pitch of the terminals. In an example, pitch of less than 500 microns (0.5 mm) between terminals was demonstrated, while in packages formed without the use of the laser, for example using dimples formed in an etch process, the minimum pitch that can be supported is 0.5 mm, due to the thin sidewalls of the dimples forming possible shorts and burrs. In contrast to a saw cut step shape formed in a multiple saw cut process, the use of the selective laser burning of the arrangements leaves the mold compound between terminals at a full dimension, forming the sides of mold compound next to the terminals helps control the solder joints, reducing the possibility of shorts between the terminals, helping enable finer pitch between terminals.

In sharp contrast to the manufacture of semiconductor device packages formed without use of the arrangements, the use of the arrangements eliminates burrs formed in dimple formation or in multiple pass saw step cutting processes on no-lead package terminals, and therefore eliminates the need for deburring the packages. Further the use of the arrangements advantageously simplifies the sawing operations to a single saw pass through the mold compound and the leadframe material, reducing costs and increasing throughput.

Figure 1B:
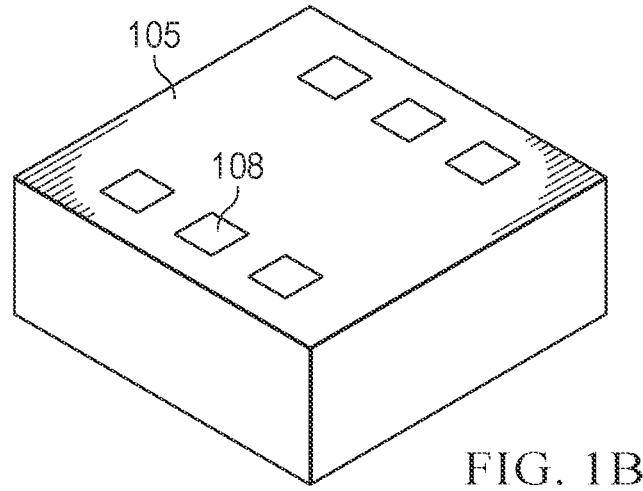

FIGS. 1A and 1B illustrate in projection views a semiconductor wafer 101 having semiconductor devices formed on it (FIG. 1A), and an individual semiconductor die 105 from the wafer for wire bonding and face up mounting (FIG. 1B), respectively. In FIG. 1A, a semiconductor wafer 101 is shown with an array of semiconductor dies 105 formed in rows and columns on a device side surface. The semiconductor dies 105 can be formed using processes typically used in a semiconductor manufacturing facility, including ion implantation, substrate doping, thermal anneals, oxidation, dielectric and metal deposition, sputter, photolithography, pattern, etch, strip, chemical mechanical polishing (CMP), electroplating, and other processes for making semiconductor devices on wafers. Scribe lanes 103 and 104, which are perpendicular to one another and which run in parallel groups across the wafer 101, separate the rows and columns of the completed semiconductor dies 105, and provide areas for dicing the semiconductor wafer 101 so as to separate the semiconductor dies 105 from one another.

FIG. 1B illustrates a single semiconductor die 105 after singulation from the semiconductor wafer 101 (see FIG. 1A), with bond pads 108, which are conductive pads that are electrically coupled to devices (not shown) formed on a device side surface of the semiconductor die 105. The bond pads 108 are configured for connection to leads of a semiconductor device package.

Figure 2A:
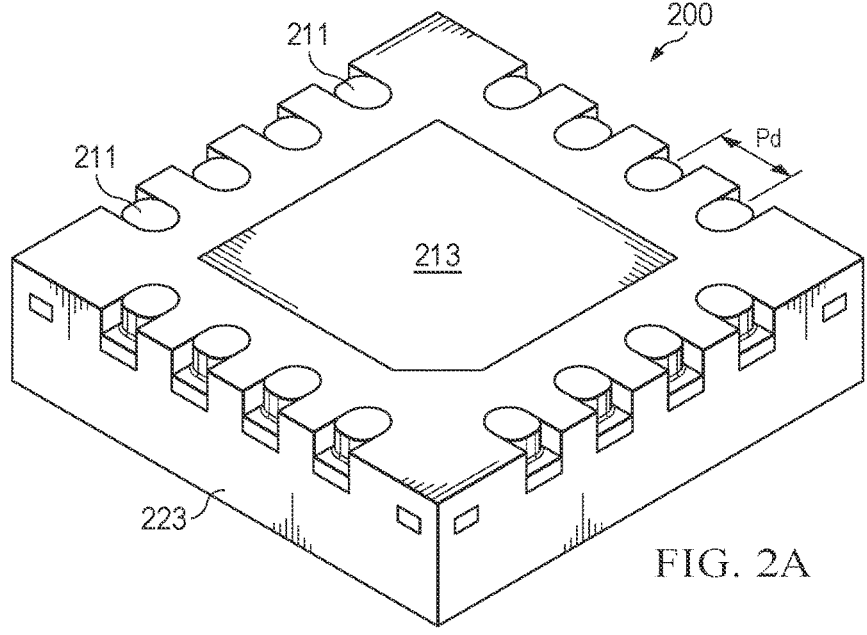
FIGS. 2A-2B illustrate, in a projection view, and in an end view, an example no-leads semiconductor device package which can be used in an arrangement.

FIG. 2A illustrates in a projection view a quad flat no-lead (QFN) semiconductor device package 200 of an example arrangement. The view in FIG. 2A is shown looking at the board side surface of the semiconductor device package 200. In the illustrated example, the semiconductor device package has sixteen terminals 211 for surface mounting to a board using solder. The terminals 211 have wettable flanks and bottom surfaces exposed from the mold compound 223. Mold compound 223 extends to a package boundary along the side of the terminals 211. Die pad 213 is exposed from the mold compound 223, and can be used as a thermal path to remove excess heat from the semiconductor die mounted within the semiconductor device package 200. Other no-lead semiconductor package types can be used with the arrangements, such as small outline no-lead (SON) packages that have terminals on two opposing sides. In FIG. 2A, the terminals 211 have a center-to-center pitch distance Pd. In an example using the arrangements, this pitch distance can be less than 0.5 millimeters, for example 0.4 millimeters. In sharp contrast, semiconductor device packages formed without use of the arrangements are limited to pitch distances of at least 0.5 millimeters, because the dimple process cannot support smaller pitch between the terminals. As device sizes and package sizes are continually decreasing, use of the arrangements enables smaller pitch between the terminals, which is needed.

Figure 2B:
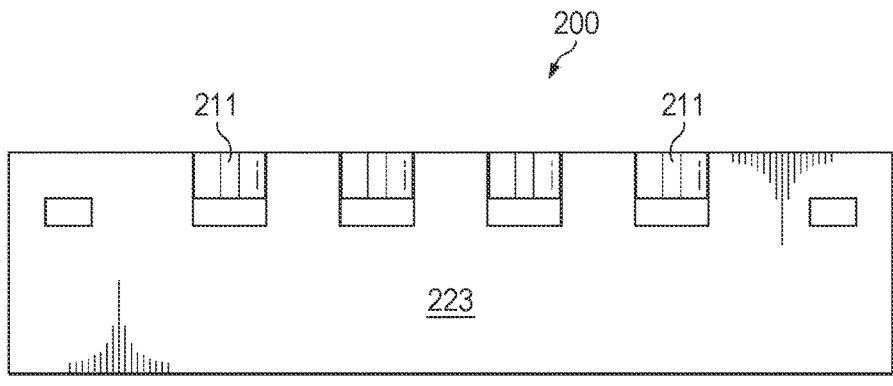

FIG. 2B is an end view of the semiconductor device package 200 illustrating the terminals 211 exposed from the mold compound 223. The board side of the semiconductor device package 200 is shown facing upwards as the semiconductor device package 200 is oriented in FIG. 2B, with the bottom surfaces of the terminals 211 at the top. The ends of the terminals 211 show the stepped edge inset from the exterior of the semiconductor device package 200. Note that due to the use of the laser to remove the mold compound 223 only from the terminals 211, the mold compound 223 between the terminals 211 is not inset.

Figure 3A:
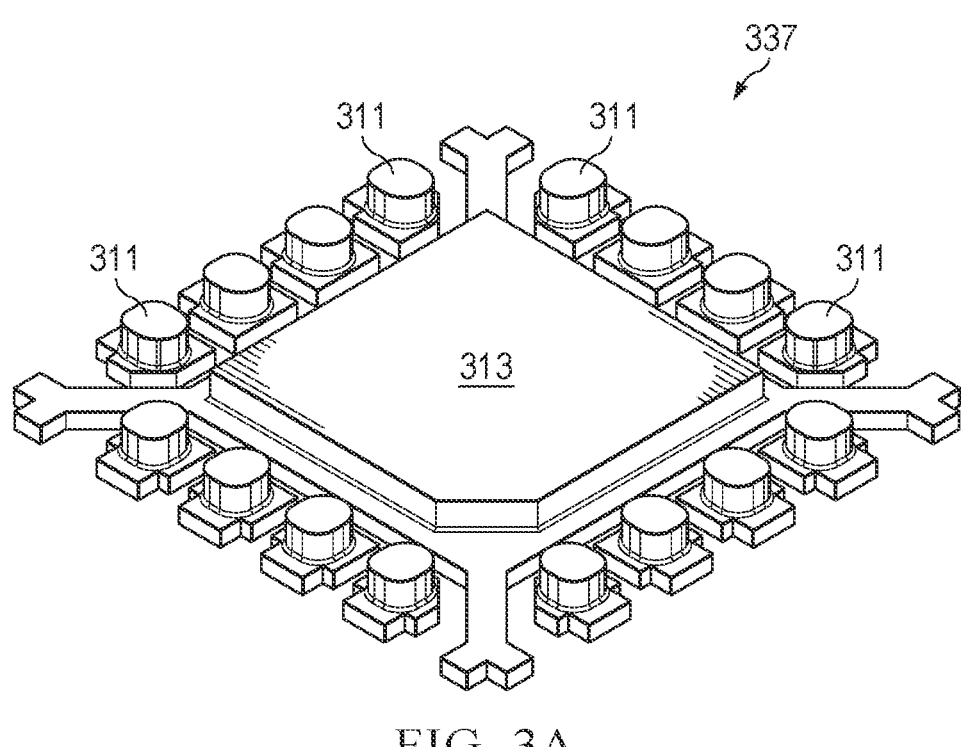
FIGS. 3A-3B illustrate, in a projection view, and a plan view, a unit leadframe for use with the arrangements.

FIG. 3A illustrates, in a projection view taken from a board side surface, a unit leadframe 337 for use with an example arrangement. Terminals 311, which are configured to be surface mounted, are formed from leadframe leads. A die pad 313 is also a part of the leadframe 337. The die pad 313 has a full thickness in the center portion, and the terminals 311 have full thickness in portions and less than full thickness in other portions. The terminals 311 are formed using partial etching of the leadframe 337 to form the stepped edge and inset portions of the terminals. The leadframe 337 can be a bare copper leadframe, or leadframe 337 can be a "pre-plated" leadframe (sometimes referred to as a "PPF") that is plated with metals to aid in soldering and die mount or wire bonding, such as gold, nickel, palladium, tungsten, silver or tin. In an example arrangement, a pre-plated leadframe has a copper base that is plated in an "ENEPIG" plating process (electroless nickel, electroless palladium, immersion gold) or an "ENIG" plating process (electroless nickel, immersion gold). The term "pre-plated" refers to a leadframe that is plated before semiconductor dies are mounted to it, in contrast some platings are done after molding for soldering terminals. These pre-platings reduce tarnish and corrosion, and prevent copper ion diffusion to the surface, increasing shelf life of the leadframe, and aiding in soldering the packaged devices to a system board. Bondability is enhanced for wire bonding or for flip chip mounting of the semiconductor die by the pre-plating process. In some examples, a bare copper leadframe is used, and after molding and sawing of semiconductor device packages formed with the bare copper leadframe, a post-molding plating, for example with tin, is used on the terminals and exposed die pad prior to surface mounting the devices.

Figure 3B:
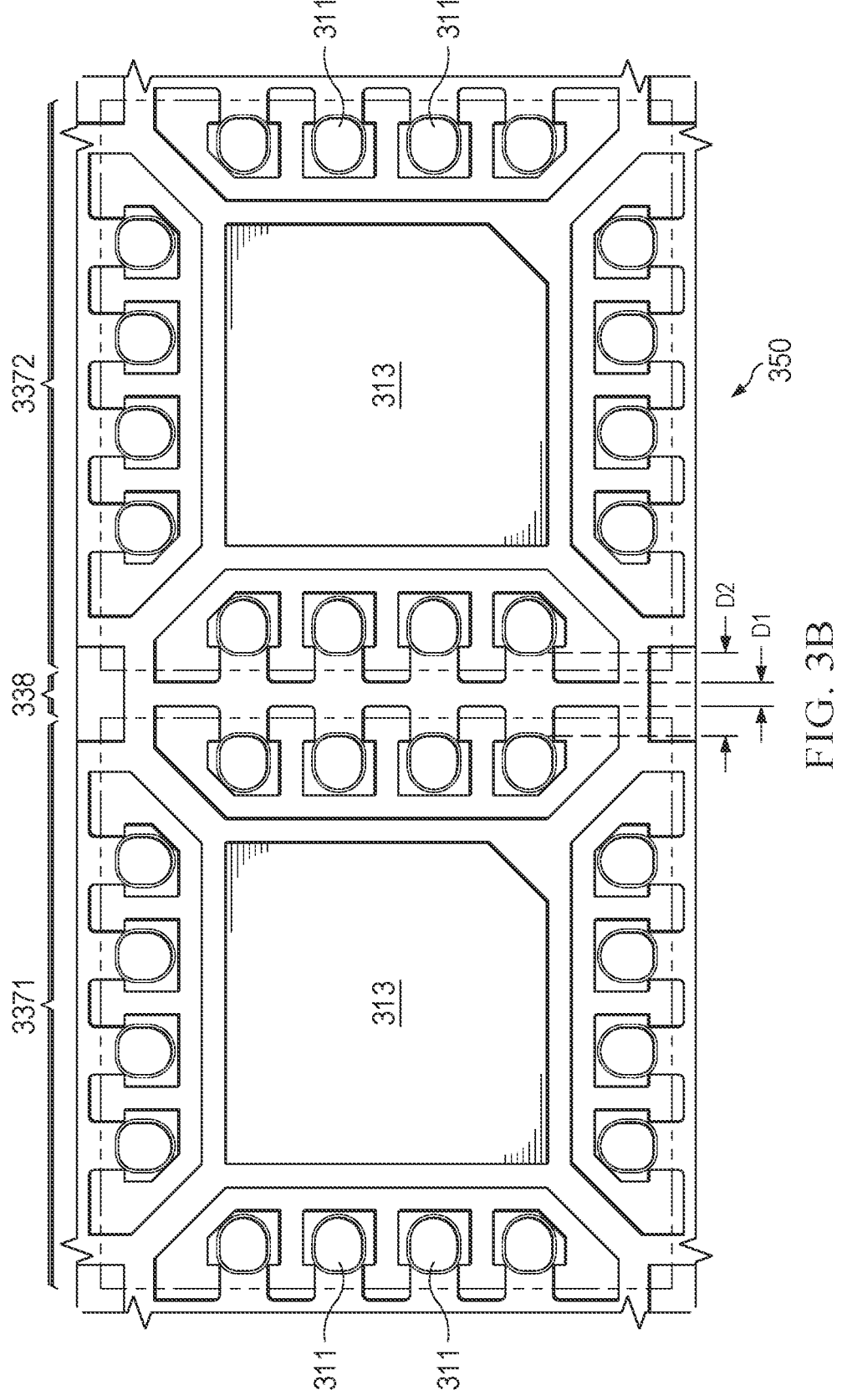

FIG. 3B illustrates, in a plan view, a portion of a leadframe strip 350 for use the arrangements. A unit leadframe 3371, which is the same as 337 in FIG. 3A, is shown in a strip with another replicated unit leadframe 3372 connected together in saw street 338. Although only two unit leadframes are shown for explanation, in a production example the leadframe strip 350 can include several, tens or hundreds of unit leadframes, and as an alternative to the leadframe strip 350, an array or grid of unit leadframes can be used.

In FIG. 3B, a saw street 338 separates the replicated unit leadframes 3371, 3372. The leadframes are joined for die mounting and molding operations, and will be separated from one another in a sawing operation after molding is completed. In an example arrangement the saw street 338 is a spacing labeled D1 that is about 150 microns wide, and the inset distance for the terminals 311 is also about 150 microns, so that the terminals 311 have a spacing labeled D2 between the stepped edges of 450 microns. The die pads 313 are shown in a central portion of the unit leadframes 3371, 3372.

Figure 3C:
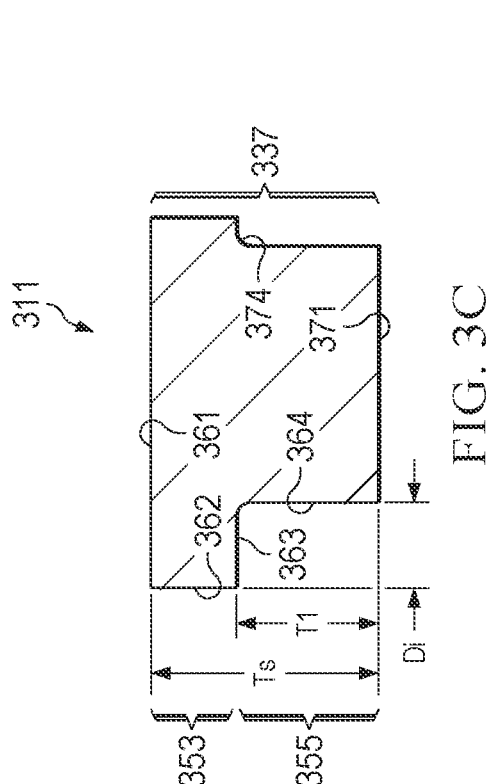
FIG. 3C illustrates in a close-up cross-section an example terminal for use in forming an arrangement.

FIG. 3C illustrates, in a cross-sectional view, an individual terminal 311 of leadframe 337 to further describe details of the terminal. The terminal 311 is shown in FIG. 3C oriented with a device side surface 361 facing upwards, and the board side surface 371 facing downwards. When a semiconductor die is later mounted to the leadframe 337, a wire bond, or alternatively a conductive post connect, will contact the device side surface 361 of the terminal 311 to make an electrical connection to the semiconductor die, as shown and described below. When a completed semiconductor device package is then surface mounted to board using surface mount technology, solder will contact the device side surface 371 and form a solder joint between the semiconductor device package terminal 311, and a conductive land on the board. The terminal 311 is formed of the partially etched leadframe 337 and has two layers, an upper layer 353 that includes the device side surface 361, and a lower layer 355 that includes the board side surface 371. The upper layer 353 has a first exterior end 362, and the lower layer 355 has a second exterior end 364 that is inset from the first exterior end 362, forming a stepped edge for the terminal 311. The bottom of the upper layer 353 extending from the first exterior end 362 forms an inset portion 363 that is parallel to the device side surface 361. The inset portion 363 and the second exterior end 364 of the lower layer 355 form a wettable flank for the terminal 311 that, when a packaged device is mounted using a surface mounting process, provide a surface that solder can wet, increasing the volume of solder used in the solder joint that will be formed (when compared to terminals for non-wettable flank no-lead packages). When a semiconductor device package of the arrangements is surface mounted to a board, the solder joint that is then made is more visible from a top side of the mounted devices, improving the ability of visual inspection to confirm the presence and quality of the solder joints (when compared to devices formed without the use of the arrangements and mounted to a board). The corner 374 between the upper layer 353 and the lower layer 355 may be rounded or curved. When the upper layer 353 and the lower layer 355 are formed in two etching processes, even if an anisotropic etch is used, the corner will not be a 90-degree angle due to the nature of metal etching processes.

Figure 4A:
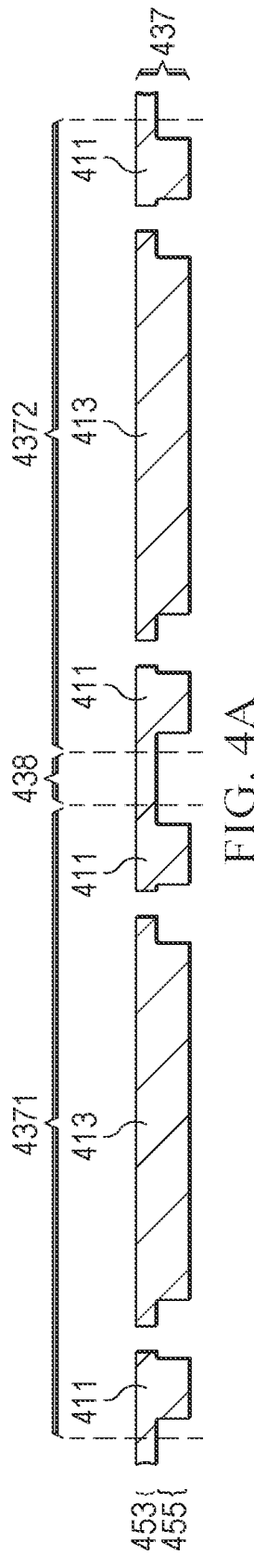
FIGS. 4A-4H illustrate, in a series of cross sectional views, selected steps for forming a semiconductor device package of an example arrangement.
Figure 4B:
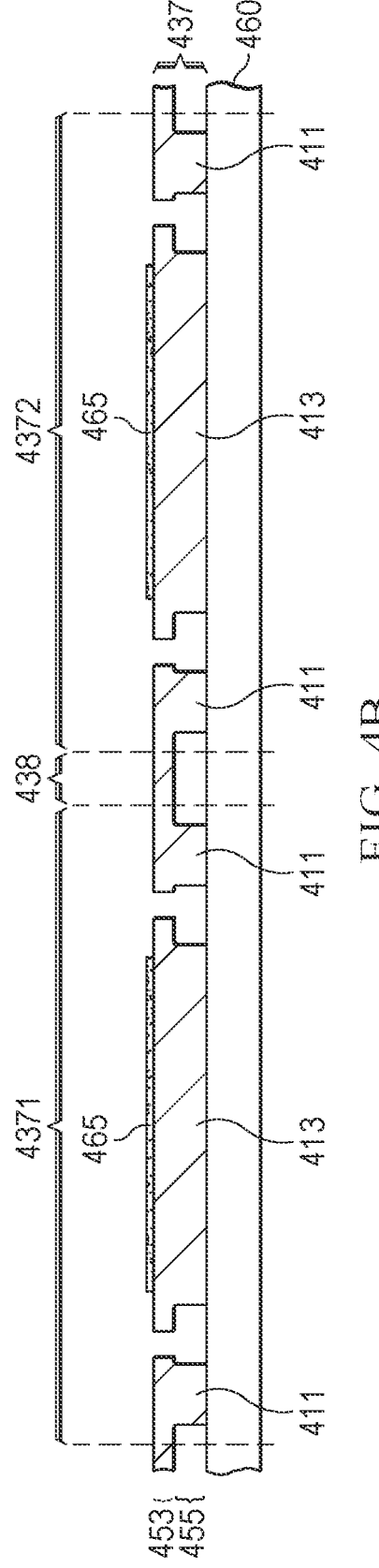
Figure 4C:
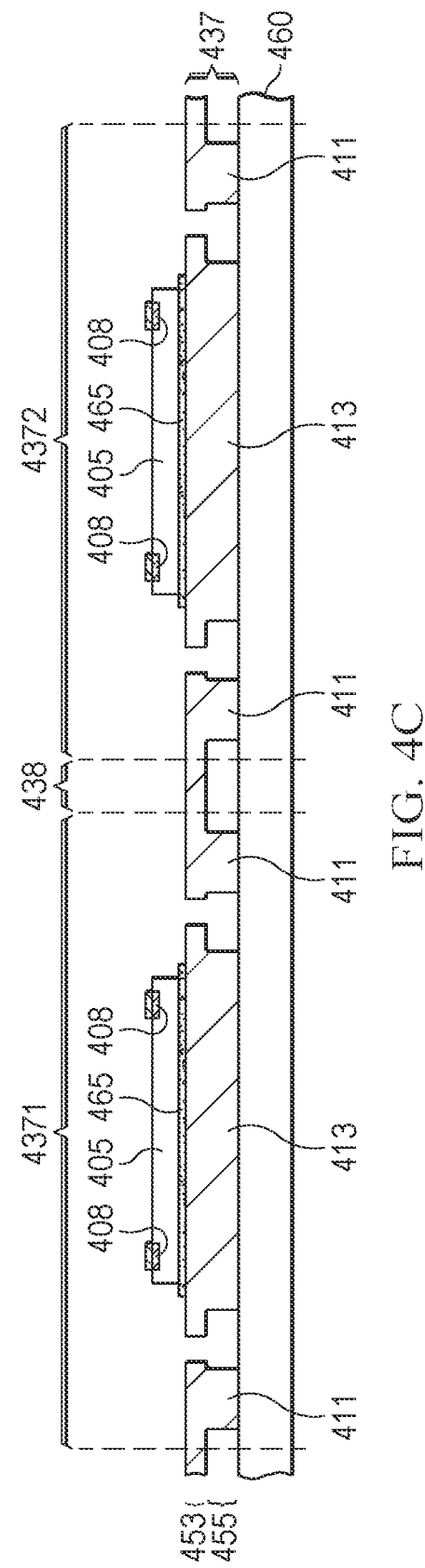
Figure 4D:
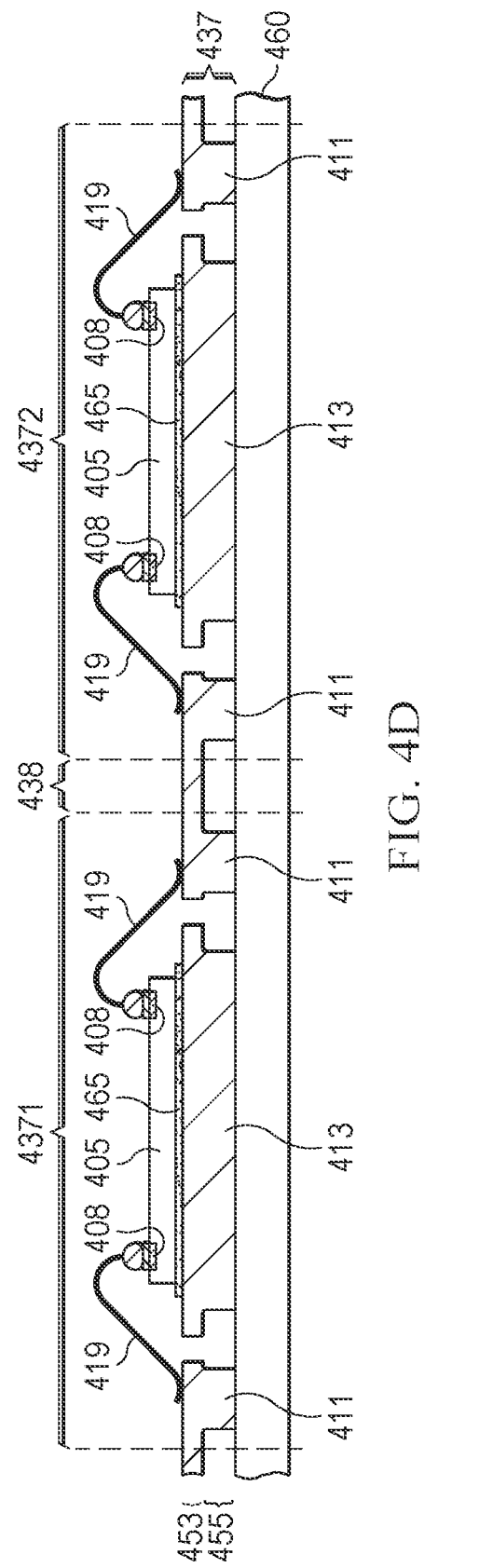
Figure 4E:
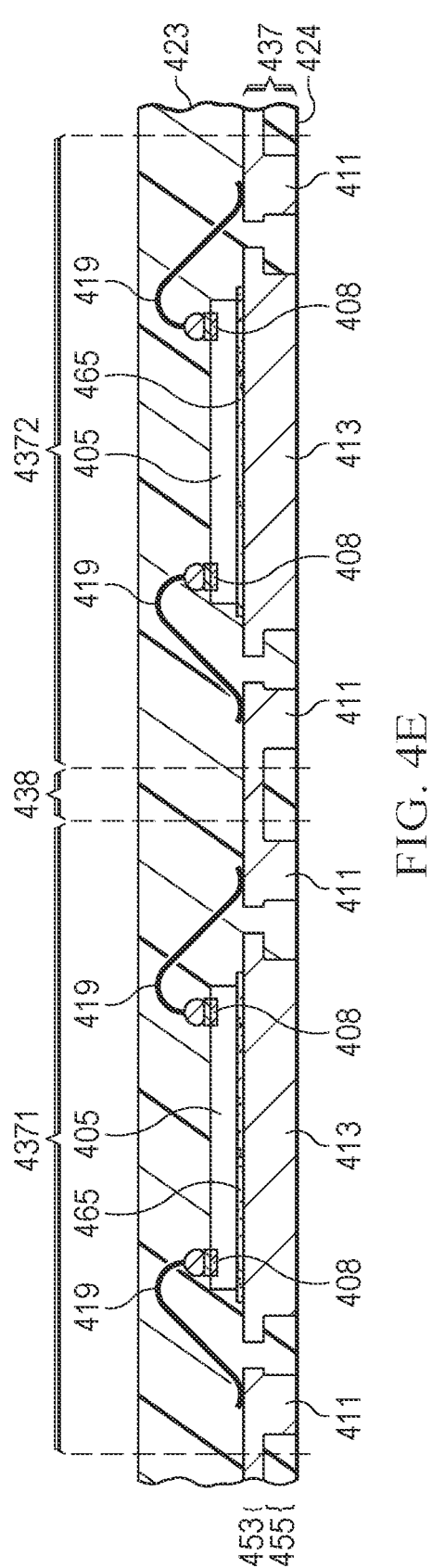
Figure 4E:
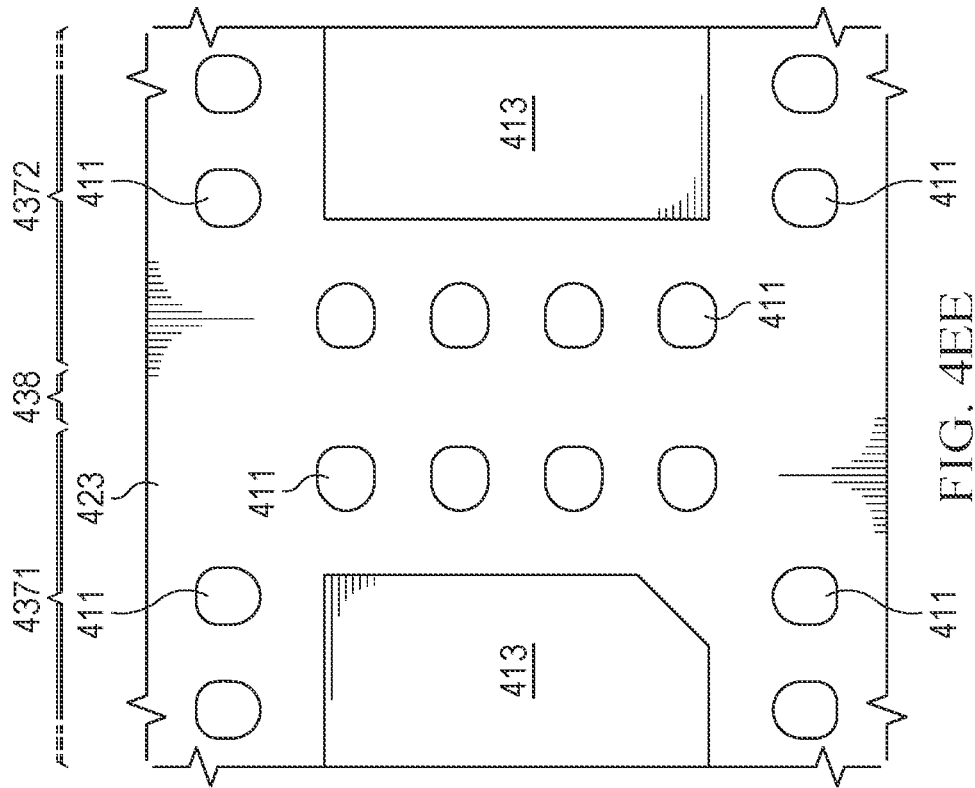

FIGS. 4A-4I illustrate, in a series of cross-sectional views, steps for forming a semiconductor device package of the arrangements and mounting it to a system board. FIG. 4EE illustrates, in a plan view, a portion of the molded semiconductor packages of FIG. 4E, FIG. 4FF illustrates, in another plan view, a portion of the molded semiconductor packages of FIG. 4F, and FIG. 4HH illustrates in a close-up view a portion of the molded semiconductor package of FIG. 4H.

In FIG. 4A, a leadframe strip 437 is shown in cross section. This leadframe strip is similar to leadframe 337 shown above. In the series of cross-sectional views of FIGS. 4A-4G, two unit leadframes 4371 and 4372 are shown. The two unit leadframes 4371 and 4372 are replicated unit leadframes, spaced by a saw street 438 that is between them. Each of the unit leadframes has terminals 411, which are similar to terminals 311 shown in FIGS. 3A-3C and a die pad 413, which is similar to die pads 313 shown in FIGS. 3A-3C FIG. 4B illustrates the leadframe 437 of FIG. 4A with unit leadframes 4371 and 4372 spaced by saw street 438, now shown on a support 460. The support 460 is configured for a wire bonding operation in this example, and can include a heater block or heater blocks for the unit leadframes 4371 and 4372. A die attach material 465 such as a die attach film or die attach epoxy is shown deposited on the device side surface of the die pad 413 for each of the unit leadframes 4371 and 4372. The die attach material 465 can be, in an example, an electrically conductive die attach. Alternatively, the die attach material can be an insulator. The die attach can be deposited as a film or tape, by a "drop on demand" or inkjet process, or by a stencil. The die attach material may be cured, if needed.

FIG. 4C illustrates the elements shown in FIG. 4B after an additional pick and place process mounts semiconductor dies 405 on the die attach material 465 for each die pad 413. The semiconductor dies 405 are shown, in the illustrated example, mounted for a wire bonding connection with bond pads 408 facing upwards, as the elements are oriented in FIG. 4C. The semiconductor dies 405 are mounted on the die pad 413 for each unit leadframe 4371, 4372 in the example shown. In a production example, the leadframe 437 can be a strip of unit leadframes and may include tens or hundreds of unit leadframes. In another example, the unit leadframes can be arranged in a grid or matrix, and can include tens, or hundreds of unit leadframes to increase throughput.

FIG. 4D illustrates, in another cross-sectional view, the elements of FIG. 4C after a wire bonding operation forms wire bonds between the bond pads 408 and the terminals 411 of the leadframe 437. The bond wires 419 can be copper, palladium coated copper, gold, or silver bond wires, in an example, copper bond wires are used. In a wire bonding process, a capillary (not shown) of a wire bonding tool has the bond wire extending through a central opening. The capillary can be a ceramic or metallic material. The end of the bond wire is used with an electric arc or flame to form a molten ball. The capillary moves the bond wire with the molten bond over a bond pad and mechanical pressure is applied to push the molten ball onto the bond pad. To increase the bond strength, the process can be performed at an elevated temperature by using a heater block to heat the leadframe and the semiconductor dies for the wire bonding process. Ultrasonic energy can be applied to the capillary during bonding to vibrate the capillary and further increase the bond strength between the ball and the bond pad. After the ball bond is formed, the capillary is moved away from the bond pad while the bond wire is allowed to extend from the ball bond. The capillary is moved over a leadframe lead such as a terminal on the leadframe where the electrical connection is to be made. The capillary again can have ultrasonic energy applied to it to cause it to vibrate. The capillary pushes the wire onto the leadframe and forms a stitch bond. After the stitch bond is formed, the capillary moves upwards a short distance and a cutter cuts or breaks the bond wire, leaving a short tail extending from the stitch bond. This process is then repeated by forming a new molten ball on the end of the bond wire and moving the capillary to a new bond pad. In a wire bonding tool, this process can be automated and many wire bonds can be completed every second. In some wire bonding tools, a heater block is used to increase the temperature of the components, to increase bond strength. In some copper wire bonding processes, the wire bonding tool is in a closed chamber that is filled with an anoxic atmosphere, to reduce oxidation and tarnish of the copper wire when it is heated during the processing.

Note that while this illustrated example shows a face up, wire bonded semiconductor device package, in an alternative arrangement, a flip chip package can be formed with wettable flanks using the arrangements, see FIG. 5, semiconductor device package 500, described below.

FIG. 4D illustrates the semiconductor dies 405 on die attach 465 with bond wires 419 formed by a ball and stitch process between bond pads 408 on the semiconductor dies 405 and a device side surface of terminals 411.

FIG. 4E illustrates the elements of FIG. 4D in another cross-sectional view, after additional processing. In FIG. 4E, a mold compound 423 is shown covering the bond wires 419, the semiconductor dies 405, and portions of the leadframe 437, with the leads 411 partially covered. The mold compound 423 can be formed, in an example process, using a thermoset epoxy resin mold compound, sometimes referred to as "electronic mold compound" or "EMC". In an example, a transfer mold is used. The leadframe 437 including the unit leadframes 4371, 4372 and the semiconductor dies 405, with bond wires 419, are placed in a mold tool. The mold tool has runners and vents and a pressure ram, so that mold compound can be forced into a mold chase that surrounds the leadframe 437. The mold compound can be provided as a solid pellet or in a powdered form. The mold compound can be heated to a liquid, and then under pressure from a mechanical ram, be pushed into the transfer mold, surrounding the devices and filling the mold chase. The mold compound 423 then can be cured to form a solid package body for the semiconductor device packages. The mold compound 423 has a device side surface 424. The terminals 411 are exposed from the mold compound 423 at the device side surface 424 of the mold compound 423, but most of the surface of the terminals 411 is covered by the mold compound 423 after molding.

FIG. 4EE illustrates a portion of the unit leadframes 4371, 4372 in a partial view looking from the board side surface 424, and showing mold compound 423. Die pads 413 and terminals 411 that have board side surfaces exposed from the mold compound 423. The mold compound covers the saw street 438 between the unit devices 4371, 4372, including portions of the terminals 411.

Figure 4F:
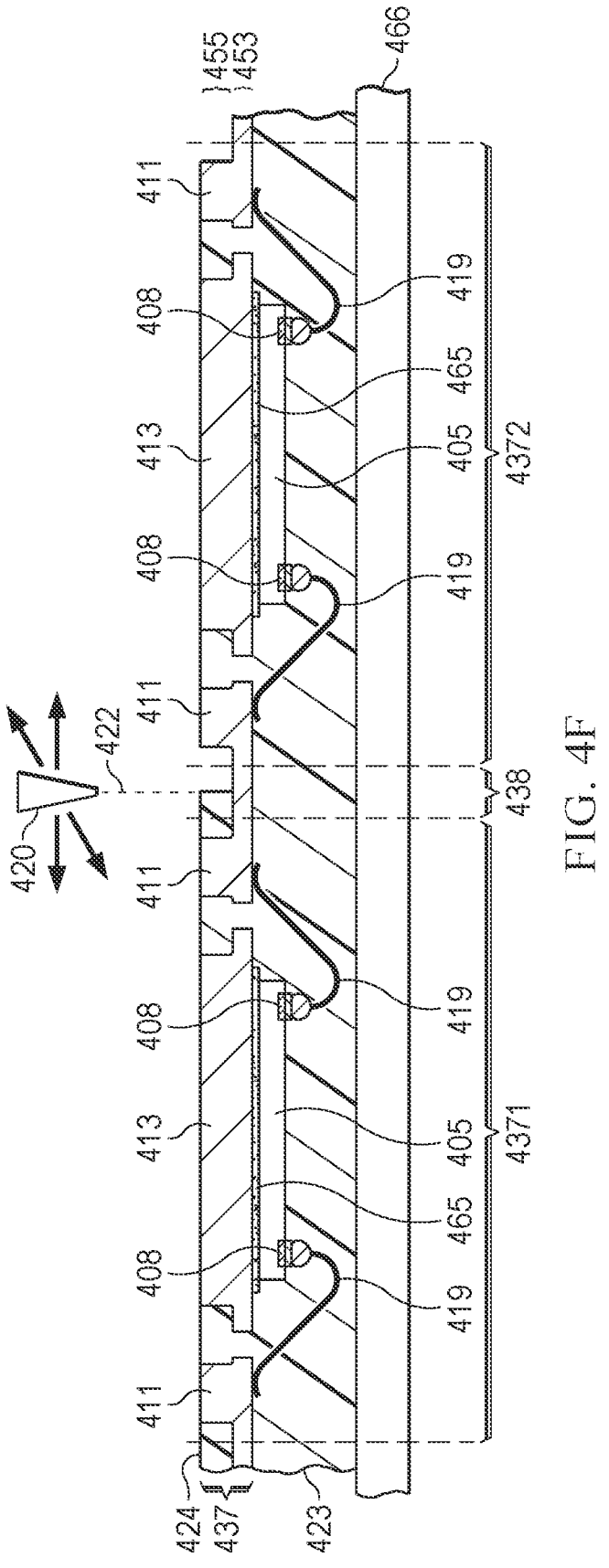
Figure 4F:
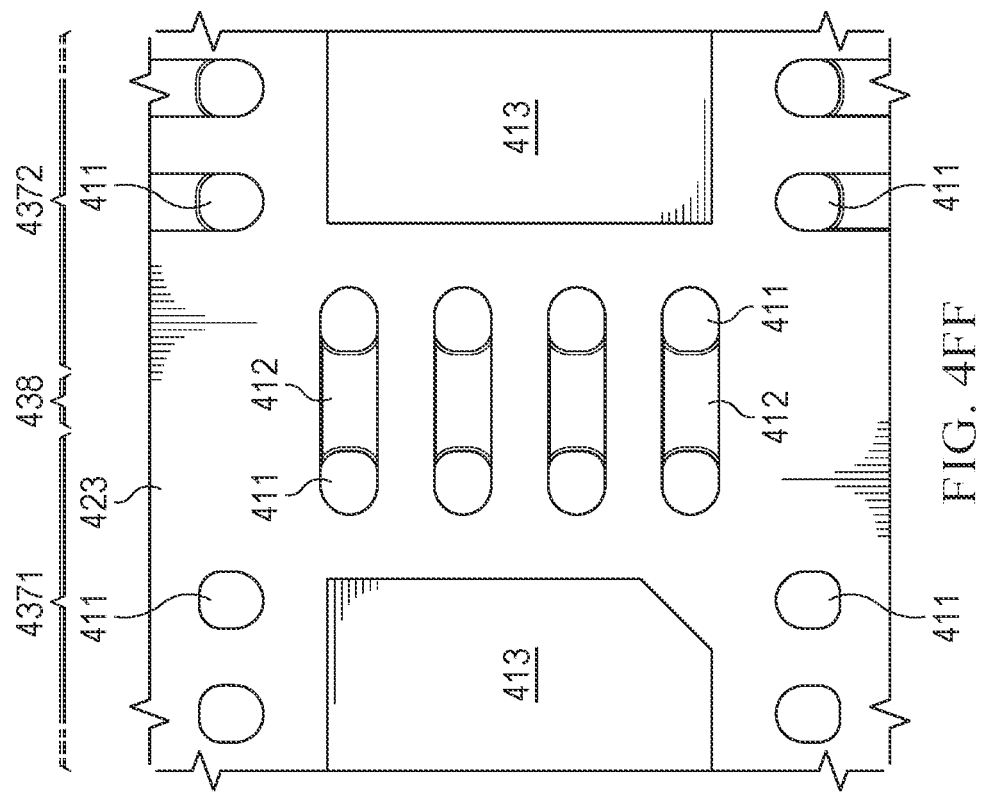

FIG. 4F illustrates, in another cross-sectional view, the elements of FIGS. 4E-4EE, in a further process. A laser 420 is shown being used to burn or ablate mold compound 423 from the terminals 411 using a laser beam 421. In FIG. 4F, the laser beam 422 is shown being directed to the saw street 438 to expose the terminals 411 from the mold compound 423, the laser beam 422 is directed to the devices at the device side surface 424 of the mold compound 423. The laser 420 will be pulsed and will burn or ablate the mold compound only where the terminals 411 are present, so that after a cleaning step, the outer sides of terminals 411 are exposed from the mold compound 423. The mold compound 423 that lies between the terminals is not impacted by the laser process, and remains unaffected.

FIG. 4FF illustrates a portion of the unit leadframes 4371, 4372 in a partial view looking from the board side surface 424, and showing mold compound 423, and die pads 413 after the laser burning process. FIG. 4FF illustrates the terminals 411 in saw street 438 after the laser beam 422 (see FIG. 4F) was applied to the mold compound. The board side surface at the outer edge of the terminals 411 is exposed from the mold compound 423 by the laser 420 (see FIG. 4F). The mold compound 423 between the terminals is not affected by the laser. Areas 412 show the openings formed by the laser in saw street 438 at the outer edge of the terminals 411.

Figure 4G:
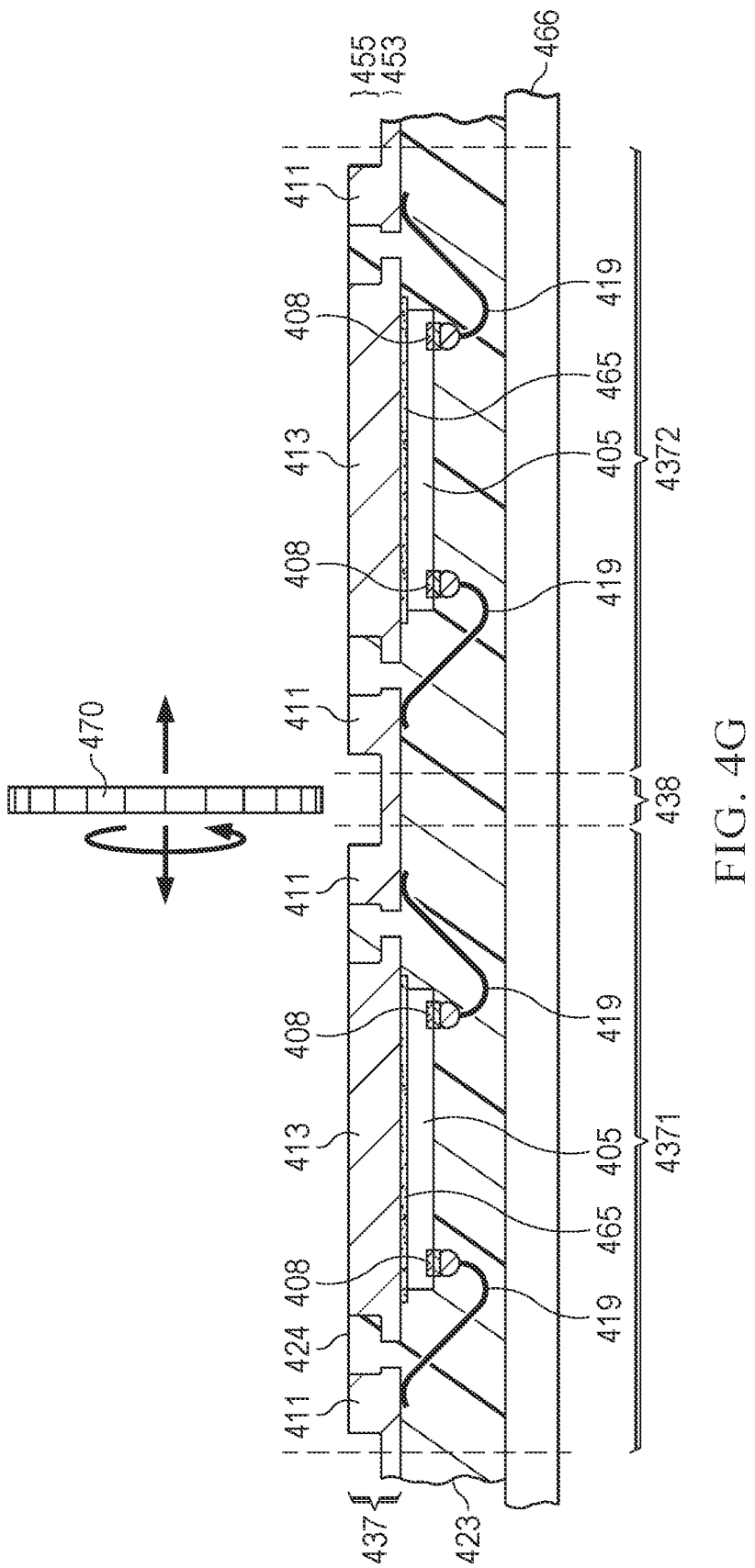

FIG. 4G illustrates, in an additional cross-sectional view, the elements of FIGS. 4F-4FF in a sawing process. In FIG. 4G, the molded unit leadframes 4371 and 4372 are shown with the board side surface 424 of the mold compound 423 facing upwards. A rotating dicing saw 470 is shown over saw street 438. In the sawing process, devices will be placed on a sawing tape or support 466, and a mechanical blade will be used to saw between the devices along saw street 438. The saw will cut through the mold compound 423 and the leadframe 437, and will separate leads 411 from adjacent unit leadframes 4371, 4372 one from another, leaving a first exterior end of the terminals 411 coextensive with an edge of the mold compound 423. The terminals 411 will be exposed from the mold compound 423 on the board side surface and will have wettable flanks on the outer side surfaces. The saw 470 will separate the molded unit lead-frames 4371 and 4372 into individual semiconductor device packages.

Figure 4H:
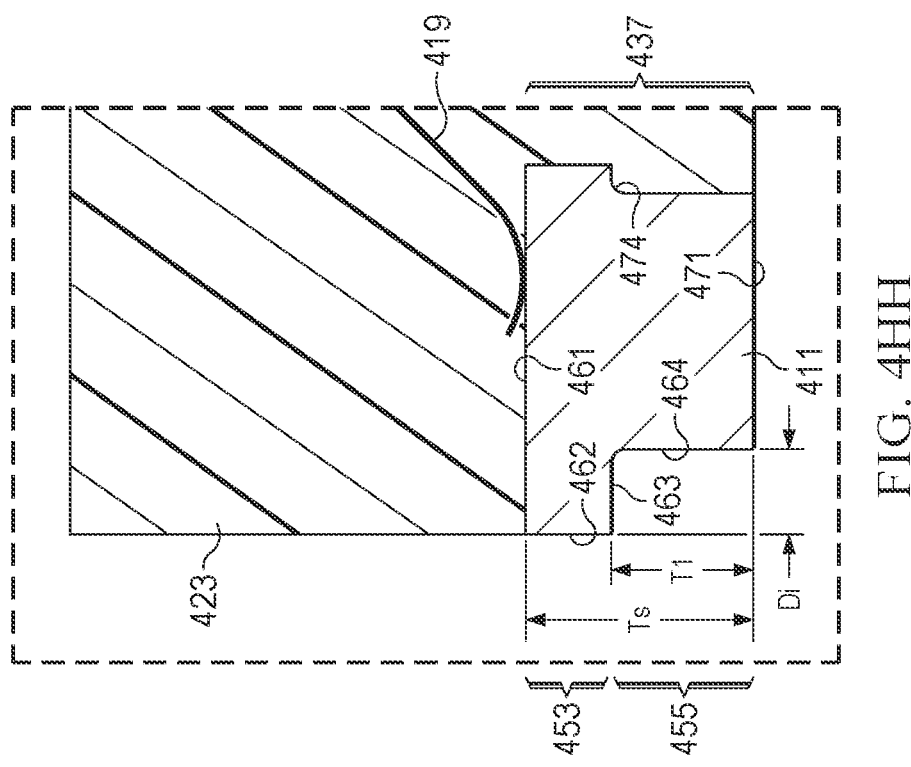
Figure 4H:
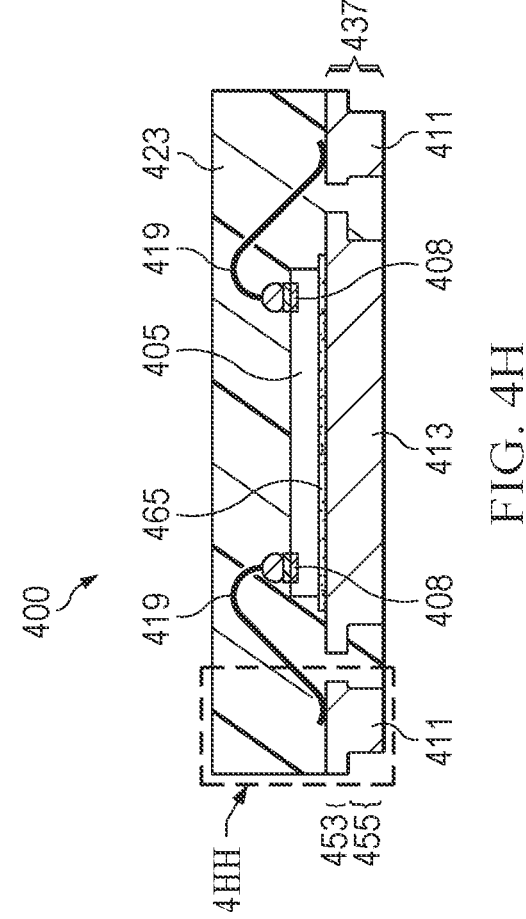

FIG. 4H illustrates, in a cross-sectional view, a semiconductor device package 400 formed by the sawing process of FIG. 4G. The illustrated example semiconductor device package 400 in FIG. 4H includes a wire bonded, face up semiconductor die 405 mounted on die attach material 465 to a die pad 413 of leadframe 437. The semiconductor die 405 is coupled to the terminals 411 by bond wires 419, which are mounted using a ball and stitch wire bonding process. Mold compound 423 covers the device side surface of the leadframe 437 including the semiconductor die 405, the bond wires 419, and portions of the terminals 411. The mold compound 423 does not cover the board side surface of the terminals 411, or the external flanks of the terminals 411, but does cover portions of the terminals 411 that are internal to the package. The die pad 413 also has a board side surface that is exposed from the mold compound on the board side surface 424 of the semiconductor device package 400.

A portion of the semiconductor device package 400 is shown in dashed lines in FIG. 4H is illustrated in FIG. 4HH. In FIG. 4HH, the close up illustrates an example terminal 411 formed in the arrangements, with the relationship of the mold compound 423 to the terminal 411 shown. Terminal 411 is similar to terminal 311 shown in FIG. 3C. The terminal 411 is partially covered by the mold compound 423 at device side surface 461, and the mold compound 423 has a side that is coextensive with the first exterior end 462 of the terminal 411, that is in the upper layer 453 of the leadframe 437. The terminal 411 has an inset portion 463 that extends in parallel to the device side surface 461 of the terminal 411 from the first exterior end 462 to the second exterior end 464, with the second exterior end 464 extending perpendicularly from the inset portion 463 to the device side surface 471 of the terminal 411. The terminal 411, as described above, is formed using an upper layer 453 and a lower layer 455 in a partial etching process for sheet material of leadframe 437. The curve 474 between the two layers 453 and 455 shows the result of the partial etching, even if an anisometric etch is used, the curve 474 is formed due to the nature of the metal etch process.

The terminals 411 are partially exposed from the mold compound 423, while the mold compound 423 is not removed in areas between the terminals 411 by the laser, so that the mold compound 423 extends along the sides of the terminals. (See, for example the mold compound 223 and terminals 211 in FIG. 2A, where the mold compound 223 extends to a package boundary on the board side surface of the semiconductor device package 200, while the terminals 211 are exposed from the mold compound and have the stepped edge that is inset from the package boundary.)

In an example, the inset distance Di is approximately 100 microns. The lower layer 455 has a thickness labeled "T1" of about 130 microns, to form the wettable flank of the terminals 411 with a sufficient spacing to enable a 110 micron thick solder joint to form when the package is mounted using surface mount technology in a later step. The thickness labeled "Ts" of the leadframe 437 is about 200 microns in an example, but can be greater or less depending on the materials used for the leadframe and the application.

Figures 4I, 5:
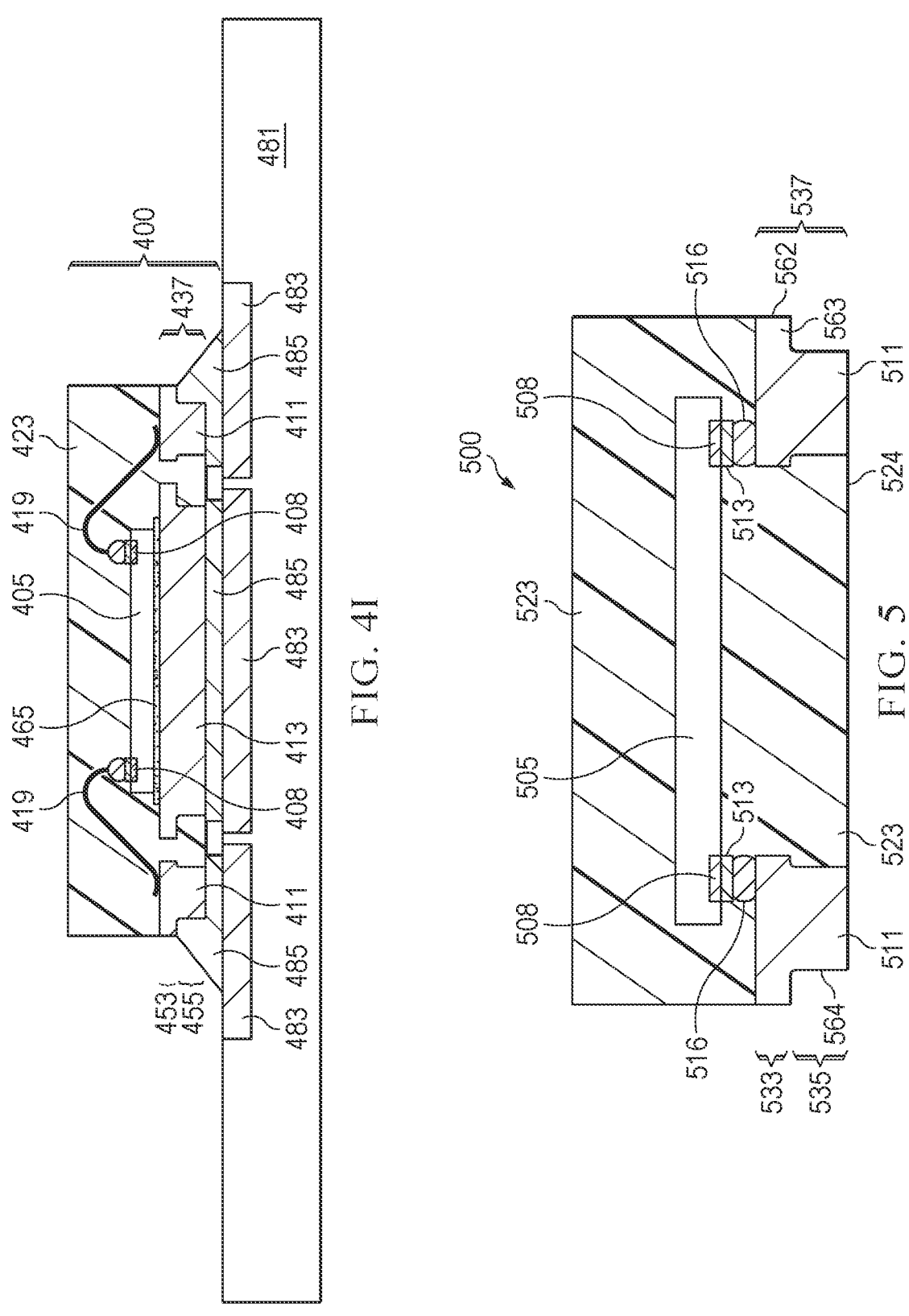
FIG. 4I illustrates in a cross-sectional view, an example semiconductor device package mounted on a board, FIG. 4EE illustrates, in a plan view, a portion of the molded semiconductor packages of FIG. 4E, FIG. 4FF illustrates, in another plan view, a portion of the molded semiconductor packages of FIG. 4F, and FIG. 4HH illustrates in a close-up view a portion of the molded semiconductor package of FIG. 4H.
FIG. 5 illustrates, in another cross-sectional view, an alternative arrangement for a semiconductor device package.

FIG. 4I illustrates, in a further cross-sectional view, the semiconductor device package 400 of FIGS. 4H-4HH after it is mounted to a board 481 using surface mounting technology (SMT). The board 481 has conductive lands 483 in locations corresponding to the terminals 411 and to the die pad 413 of the semiconductor device package 400. Solder joints 485 are formed on the terminals and between the die pad 413 and the board 481. In an example SMT process, solder paste is applied to the conductors 483 on the board 481, and the semiconductor device package 400 is placed on the board for soldering. A solder reflow process then melts the solder and forms the solder joints 485. As shown in FIG. 4I, the solder joints 485 extend upwards and fill the wettable flanks at the ends of the terminals 411, and also form solder on the device side surface of the terminals 411. The solder joints 485 have greater volume than solder joints formed for a packaged device with non-wettable flanks, and thus are more visible in a visual inspection step, allowing for greater productivity at lower costs. The use of the laser in the arrangements to expose the stepped edge of the terminals from the mold compound, leaving the mold compound intact between the terminals, enables a single sawing operation to be performed, lowers costs by removing the need to deburr the terminals and simplifies the processes for forming the wettable flanks on the semiconductor device package 400 of the arrangement.

FIG. 5 illustrates, in an additional cross-sectional view, an alternative semiconductor device package 500 that can be formed in an alternative arrangement. In FIG. 5, the semiconductor device package 500 is a "flip chip on lead" of "FCOL" semiconductor device package, where the semiconductor die 505 is mounted using conductive post connects that are soldered to leads of the leadframe in a face down orientation. There is no die pad in a FCOL package, reducing the board area and size of the semiconductor device package.

In the example arrangement illustrated in FIG. 5, the terminals 511 have features similar to the features of terminal 311 (see FIG. 3C), and of terminal 411 (see, for example FIGS. 4H and 4HH). The leadframe 537 can be a partially etched leadframe formed from a sheet of copper material or other leadframe material, and has an upper layer 533, and a lower layer 535, these layers are formed by partially etching the leadframe 537 from opposite sides. The terminals 511 have a board side surface that is coextensive with the board side surface 524 of the semiconductor device package 500, the board side surface of the terminals is exposed from the mold compound 523. The semiconductor die 505 is shown with conductive post connects 513 and solder 516 used to mount the semiconductor die 505 to the leadframe 527 using flip chip mounting, with solder reflow processes used to form the solder connections between the semiconductor die and the terminals 511.

FIG. 5 illustrates mold compound 523 covering the semiconductor die 505, and device side surface of the upper layer 533 of the leadframe 537, as well as part of the board side surface of the terminals 511. The mold compound 523 is coextensive with the first exterior end 562 of the upper layer of the leadframe 537. The terminals 511 have wettable flanks, similar to those of the terminals 311 in FIG. 3C and 411 in FIG. 4H, for example. An inset portion 563 extends at a normal angle to the first exterior end 562 of the upper layer 533, and extends to the second exterior end 564 of the lower layer 535. The second exterior end 564 of the lower layer forms a stepped edge shape for the terminals 511, and this shape increases the volume of a solder joint that will be formed when the semiconductor device package 500 is later mounted to a board by surface mount technology (SMT). The arrangement of FIG. 5 is a flip chip on lead arrangement, and uses a partially etched leadframe to form the terminals with wettable flanks, in forming the semiconductor device package 500 the laser method is used to remove mold compound from the terminals as described above.

FIG. 6 illustrates, in a flow diagram, steps for forming an arrangement corresponding to the steps shown in the series of illustrations 4A-4E.

At step 601, the method begins by placing a partially etched leadframe on a support with a board side surface of the leadframe facing the support, the partially etched leadframe including unit leadframe devices having terminals with a device side surface opposite the board side surface on an upper layer, and having a board side surface on a lower layer extending from the upper layer, a first exterior end of the terminals formed on the upper layer, and the terminals with a planar surface on the lower layer on the board side surface, and a second exterior end formed on the lower layer, the second exterior end of the terminals inset from the first exterior end by an inset portion. (See, for example, the partially etched leadframe 437 in FIG. 4A, with leads 411, and the details of the leads 411 in FIG. 4HH).

At step 603, the method continues by depositing die attach material on a die pad on the device side surface of the unit leadframe devices. (See, for example, FIG. 4B, with die attach material 465).

At step 605, the method continues by mounting semiconductor dies on the die pads using the die attach material with bond pads of the semiconductor dies facing away from the die pad. (See, for example, the semiconductor dies 405 of FIG. 4C).

At step 607, the method continues, by forming bond wire connections between the bond pads and the device side of the terminals. (See the bond wires 419 in FIG. 4D).

At step 609, the method continues, covering the semiconductor die, the partially etched leadframe and portions of the terminals with mold compound to form semiconductor device packages, the mold compound covering the second edge of the terminals and the inset portion of the terminals, the board side surface of the terminals exposed from the mold compound. (See the mold compound 423 in FIG. 4E and in FIG. 4EE).

At step 611, a laser is selectively uses on the board side surface of the unit leadframes, removing the mold compound from at least the second edge of the terminals and the inset portion of the terminals. (See laser 420 with laser beam 423 in FIG. 4F, and the terminals 411 in FIG. 4FF).

At step 613, the method completes by using a saw, cutting along saw streets to separate unit semiconductor device packages on the partially etched leadframe from one another. (See, for example, FIG. 4G, with saw 470).

FIG. 7 illustrates, in another flow diagram, an alternative method of the arrangements for forming a flip chip on lead semiconductor device package.

The method of FIG. 7 begins at step 701 by placing a partially etched leadframe on a support with a board side surface of the leadframe facing the support, the partially etched leadframe including unit leadframe devices having terminals with a device side surface opposite the board side surface on an upper layer, and the board side surface on a lower layer extending from the upper layer, a first exterior end of the terminals formed on the upper layer, and the terminals with a planar surface on the lower layer on the board side surface, and a second exterior end of the terminals formed on the lower layer, the second exterior end inset from the first exterior end of the terminals by an inset portion. (See, for example, the partially etched leadframe 437 in FIG. 4A, with leads 411, and the details of the leads 411 in FIG. 4HH).

At step 703, the method continues by flip chip mounting semiconductor dies on the device side surface of the unit leadframes, the semiconductor dies having conductive post connects extending from the semiconductor dies to the device side surface of the terminals, and forming solder joints to the conductive post connects. (See, for example, FIG. 5, with semiconductor device package 500 showing a flip chip mounted semiconductor die 505).

At step 705, the method continues by covering the semiconductor die, the partially etched leadframe and portions of the terminals with mold compound to form semiconductor device packages, the mold compound covering the second exterior end of the terminals and the inset portion of the terminals, the board side surface of the terminals exposed from the mold compound. (See, for example, the mold compound 423 in FIG. 4E and in FIG. 4EE, and the mold compound 523 in FIG. 5 for the flip chip type of package).

At step 707, the method continues by selectively using a laser on the board side surface of the unit leadframes, removing the mold compound from second exterior end of the terminals and the inset portion of the terminals to form wettable flanks with the inset portion and the second exterior end exposed to form a stepped edge. (See laser 420 with laser beam 423 in FIG. 4F, and the terminals 411 in FIG. 4FF).

At step 709, the method completes by using a saw, cutting along saw streets to separate unit semiconductor device packages on the partially etched leadframe from one another. (See, for example, FIG. 4G, with saw 470).

Use of the arrangements provides no-lead packages with wettable flanks. The use of the arrangements allows for no-lead packages with wettable flanks having reduced terminal pitch, and having terminals with stepped edges with mold compound along the sides of the terminals. Use of a laser to selectively remove mold compound from terminals formed with a partially etched leadframe provides a semiconductor device package with wettable flanks that can be formed using a single sawing operation to form the packages, and without the use of dimpled leadframes, which can create burrs requiring deburring processes. The arrangements eliminate the defects of packages formed using prior approaches, without added cost, and simplifies processing for manufacture of no-lead packages with wettable flanks.

Modifications are possible in the described arrangements, and other alternative arrangements are possible within the scope of the claims.

What is claimed is:

1. A method, comprising:

placing a partially etched leadframe with a board side surface facing a support, the partially etched leadframe including unit leadframe devices having terminals with a device side surface opposite the board side surface on an upper layer, and having the board side surface on a lower layer extending from the upper layer, a first exterior end of the terminals formed on the upper layer, and the terminals with a planar surface on the lower layer on the board side surface, and a second exterior end formed on the lower layer, the second exterior end of the terminals inset from the first exterior end by an inset portion;

depositing die attach material on a die pad on the device side surface of the unit leadframe devices;

mounting semiconductor dies on the die pads using the die attach material with bond pads of the semiconductor dies facing away from the die pad;

forming bond wire connections between the bond pads and the device side of the terminals;

covering the semiconductor dies, the partially etched leadframe and portions of the terminals with mold compound to form semiconductor device packages, the mold compound covering the second exterior end of the terminals and the inset portion of the terminals, with the board side surface of the terminals exposed from the mold compound;

selectively using a laser on the board side surface of the unit leadframes, removing the mold compound from at least the second exterior end of the terminals and the inset portion of the terminals; and using a saw, cutting along saw streets between the unit leadframes to form separate unit semiconductor device packages.

2. The method of claim 1, wherein selectively using the laser on the board side surface of the unit leadframe devices does not remove the mold compound between the terminals.

3. The method of claim 1, wherein after selectively using the laser, the terminals have exposed sides formed from the mold compound.

4. The method of claim 1, wherein the terminals have a pitch distance of less than 0.5 millimeters.

5. The method of claim 1, wherein after the saw is used, the first exterior end of the terminals, the second exterior end of the terminals, and the inset portion are exposed from the mold compound.

6. The method of claim 1, wherein the partially etched leadframe is a bare copper leadframe.

7. The method of claim 1, wherein the partially etched leadframe is a pre-plated leadframe that is plated with gold, nickel, palladium, tungsten, silver or tin.

8. The method of claim 1, wherein the partially etched leadframe is a pre-plated leadframe that is plated with an "ENEPIG" (electroless nickel, electroless palladium, immersion gold) or "ENIG" (electroless nickel, immersion gold) plating.

9. The method of claim 1, wherein forming bond wire connections further comprises:

forming a ball at the end of a bond wire extending from an opening in a capillary of a wire bonder;

mechanically pressing the ball onto a bond pad to form a ball bond between the bond wire and a bond pad;

moving the capillary, extending the bond wire from the ball bond over an a device side surface of one of the terminals; and mechanically pressing the bond wire on the device side surface of the one of the terminals, forming a stitch bond.

10. The method of claim 1, and further comprising leaving the board side surface of the die pad exposed from the mold compound.

11. The method of claim 1, and further comprising:

forming solder paste on the conductors on a board configured for surface mounting a unit semiconductor device package;

placing the board side surface of the unit semiconductor device package on the board, the terminals contacting the solder paste; and performing a solder reflow process to form solder joints between the terminals and the conductors on the board.

12. A method, comprising:

placing a partially etched leadframe with a board side surface of the leadframe facing a support, the partially etched leadframe including unit leadframe devices spaced by saw streets and having terminals with a device side surface opposite the board side surface on an upper layer, and the board side surface on a lower layer extending from the upper layer, a first exterior end of the terminals formed on the upper layer, and the terminals with a planar surface on the lower layer on the board side surface, and a second exterior end of the terminals formed on the lower layer, the second exterior end inset from the first exterior end of the terminals by an inset portion;

flip chip mounting semiconductor dies on the device side surface of the unit leadframe devices, conductive post connects extending from the semiconductor dies to the device side surface of the terminals, and forming solder joints to the conductive post connects;

covering the semiconductor die, the partially etched leadframe and portions of the terminals with mold compound to form semiconductor device packages, the mold compound covering the second exterior end of the terminals and the inset portion of the terminals, the board side surface of the terminals exposed from the mold compound;

selectively using a laser on the board side surface of the unit leadframe devices, removing the mold compound from the second exterior end of the terminals and the inset portion of the terminals to form wettable flanks with the inset portion and the second exterior end exposed to form a stepped edge; and cutting along the saw streets to separate unit semiconductor device packages on the partially etched leadframe from one another.

13. The method of claim 12, and further comprising:

forming solder paste on the conductors on a board configured for surface mounting a semiconductor device package;

placing the board side surface of the semiconductor device package on the board, the terminals contacting the solder paste; and performing a solder reflow process to form solder joints between the terminals and the conductors on the board.

14. The method of claim 12, wherein the terminals have a pitch distance of less than 0.5 millimeters.

15. The method of claim 12, wherein the partially etched leadframe is a bare copper leadframe.

16. The method of claim 12, wherein the partially etched leadframe is a pre-plated leadframe that is plated with gold, nickel, palladium, tungsten, silver or tin.

17. A no-lead semiconductor device package, comprising:

a die pad in a central portion of a partially etched leadframe, the die pad having a device side surface and an opposite board side surface;

terminals spaced from the die pad, the terminals comprising:

a device side surface formed in an upper layer of the partially etched leadframe, and a first exterior end in the upper layer of the partially etched leadframe;

a board side surface formed in a lower layer of the partially etched leadframe extending from the upper layer, the board side surface of the terminal opposite the device side surface;

a second exterior end in the lower layer of the partially etched leadframe, the second exterior end inset from the first exterior end, and an inset portion extending from the first exterior end to the second exterior end, a plane along a surface of the inset portion parallel to a plane along the board side surface;

a semiconductor die mounted to the device side surface of the die pad by die attach material and having bond pads on a device side surface facing away from the die pad;

wire bonds connecting bond pads of the semiconductor die to the device side surface of the terminals; and mold compound covering the semiconductor die, the die pad, and the wire bonds, the second exterior end of the terminals and the inset portion of the terminals exposed from the mold compound, with the inset portion and the second exterior end forming a stepped edge, with mold compound extending along sides of the terminals.

18. The apparatus of claim 17, wherein the terminals have a pitch distance between terminals of less than 0.5 millimeters.

19. A no-lead semiconductor device package, comprising:

a partially etched leadframe including terminals, the terminals comprising:

a device side surface formed in an upper layer of the partially etched leadframe, and a first exterior end in the upper layer of the partially etched leadframe;

a board side surface formed in a lower layer of the partially etched leadframe extending from the upper layer, the board side surface of the terminal opposite the device side surface;

a second exterior end in the lower layer of the partially etched leadframe, the second exterior end inset from the first exterior end, and an inset portion extending from the first exterior end to the second exterior end, a plane along a surface of the second exterior end parallel to a plane along a surface of the first exterior end;

a semiconductor die flip chip mounted to the device side surface of the terminals by solder joints between post connects extending from bond pads on the semiconductor die and the device side surface of the terminals; and mold compound covering the semiconductor die and portions of the terminals, with the second exterior end of the terminals and the inset portion of the terminals exposed from the mold compound to form wettable flanks with the inset portion and the second end forming stepped edges on the terminals, with mold compound extending along the sides of the terminals.

20. The no-lead semiconductor device package of claim 19, wherein the terminals have a pitch distance between terminals of less than 0.5 millimeters.

* * * * *